(12) United States Patent
Yoshida et al.

(10) Patent No.: US 12,092,847 B2
(45) Date of Patent: Sep. 17, 2024

(54) CIRCULARLY POLARIZING PLATE AND ORGANIC ELECTROLUMINESCENT DISPLAY DEVICE

(71) Applicant: FUJIFILM Corporation, Tokyo (JP)

(72) Inventors: Shinpei Yoshida, Kanagawa (JP); Yuta Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/068,211

(22) Filed: Dec. 19, 2022

(65) Prior Publication Data

US 2023/0120119 A1    Apr. 20, 2023

Related U.S. Application Data

(63) Continuation of application No. PCT/JP2021/023379, filed on Jun. 21, 2021.

(30) Foreign Application Priority Data

Jun. 22, 2020   (JP) .................................. 2020-107171

(51) Int. Cl.
*G02B 5/30* (2006.01)
*H10K 50/80* (2023.01)

(52) U.S. Cl.
CPC ......... *G02B 5/3016* (2013.01); *H10K 50/868* (2023.02)

(58) Field of Classification Search
CPC .............................. G02B 5/3016; H10K 50/868
(Continued)

(56) References Cited

U.S. PATENT DOCUMENTS

2008/0106675 A1    5/2008   Uesaka et al.
2013/0027656 A1*   1/2013   Escuti .................. G02B 5/3083
                                                               349/193

(Continued)

FOREIGN PATENT DOCUMENTS

JP    2007-003824 A    1/2007
JP    2014-209219 A    11/2014
(Continued)

OTHER PUBLICATIONS

Office Action issued by the Japanese Patent Office on May 30, 2023, in Connection with Japanese Patent Application No. 2022-531969.

(Continued)

*Primary Examiner* — Charles S Chang
(74) *Attorney, Agent, or Firm* — Edwards Neils LLC; Jean C. Edwards, Esq.

(57) ABSTRACT

Provided is a circularly polarizing plate with which, in a case where a display device obtained by disposing the circularly polarizing plate on a display element is viewed from an oblique direction while the direction thereof is being changed, the display device exhibits little change in tint and has a low reflectivity; and an organic electroluminescent display device. The circularly polarizing plate includes a polarizer and an optically anisotropic layer, in which the optically anisotropic layer is a layer formed by fixing a liquid crystal compound having reverse wavelength dispersibility twist-aligned with a thickness direction as a helical axis, the molecular axis of the liquid crystal compound in the optically anisotropic layer is horizontal to the surface of the optically anisotropic layer, and the twisted angle of the twist-aligned liquid crystal compound is 15° to 360°.

7 Claims, 8 Drawing Sheets

(58) Field of Classification Search
USPC ...................................... 349/96–98, 117–121
See application file for complete search history.

(56) References Cited

U.S. PATENT DOCUMENTS

| | | |
|---|---|---|
| 2014/0284582 A1* | 9/2014 | Saitoh .................... H10K 50/86 349/194 |
| 2014/0284583 A1 | 9/2014 | Saitoh et al. |
| 2016/0187554 A1 | 6/2016 | Lee et al. |
| 2020/0041708 A1 | 2/2020 | Saitoh et al. |

FOREIGN PATENT DOCUMENTS

| | | |
|---|---|---|
| JP | 2014-209220 A | 11/2014 |
| JP | 2015-111257 A | 6/2015 |
| JP | 2016-528543 A | 9/2016 |
| WO | 2018/190196 A1 | 10/2018 |

OTHER PUBLICATIONS

Office Action issued by the Japanese Patent Office on Aug. 8, 2023, in Connection with Japanese Patent Application No. 2022-531969.
International Search Report issued in PCT/JP2021/023379 on Sep. 7, 2021.
Written Opinion issued in PCT/JP2021/023379 on Sep. 7, 2021.
International Preliminary Report on Patentability completed by WIPO on Dec. 13, 2022 in connection with International Patent Application No. PCT/JP2021/023379.

* cited by examiner

CIRCULARLY POLARIZING PLATE AND ORGANIC ELECTROLUMINESCENT DISPLAY DEVICE

CROSS-REFERENCE TO RELATED APPLICATIONS

This application is a Continuation of PCT International Application No. PCT/JP2021/023379 filed on Jun. 21, 2021, which was published under PCT Article 21(2) in Japanese, and which claims priority under 35 U.S.C. § 119(a) to Japanese Patent Application No. 2020-107171 filed on Jun. 22, 2020. The above applications are hereby expressly incorporated by reference, in its their entirety, into the present application.

BACKGROUND OF THE INVENTION

1. Field of the Invention

The present invention relates to a circularly polarizing plate and an organic electroluminescent display device.

2. Description of the Related Art

An optically anisotropic layer having refractive index anisotropy is applied to various applications such as an antireflection film of a display device and an optical compensation film of a liquid crystal display device.

JP2015-111257A discloses a circularly polarizing plate having an optically anisotropic layer formed of a liquid crystal compound having reverse wavelength dispersibility.

SUMMARY OF THE INVENTION

On the other hand, in recent years, it is desirable for a display device, which is represented by an organic electroluminescent (EL) display device, to exhibit little change in tint in a case where the display device is viewed from an oblique direction while the direction thereof is being changed, in order to further improve the image quality of the display device.

In addition, it is also desirable for the display device to have a low reflectivity. More specifically, it is also desirable for the display device that an average reflectivity, which is an average value of reflectivities in each direction, is low in a case where the display device is viewed from an oblique direction while the direction thereof is being changed.

In a case where the circularly polarizing plate disclosed in JP2015-111257A is prepared and attached to a display element, and the performance of the resulting structure is evaluated, the present inventors have found that the above-described requirements are not sufficiently satisfied.

The present invention has been made in view of the above circumstances, and an object of the present invention is to provide a circularly polarizing plate with which, in a case where a display device obtained by disposing the circularly polarizing plate on a display element is viewed from an oblique direction while the direction thereof is being changed, the display device exhibits little change in tint and has a low reflectivity.

Another object of the present invention is to provide an organic electroluminescent display device.

As a result of extensive studies on the problems of the related art, the present inventors have found that the foregoing objects can be achieved by the following configurations.

(1) A circularly polarizing plate comprising a polarizer and an optically anisotropic layer,
in which the optically anisotropic layer is a layer formed by fixing a liquid crystal compound having reverse wavelength dispersibility twist-aligned with a thickness direction as a helical axis,
a molecular axis of the liquid crystal compound in the optically anisotropic layer is horizontal to a surface of the optically anisotropic layer, and
a twisted angle of the twist-aligned liquid crystal compound is 15° to 360°.

(2) The circularly polarizing plate according to (1), in which only the optically anisotropic layer is provided as an optically anisotropic layer formed of a liquid crystal compound,
the twisted angle is in a range of 64°±20°, and
a value of a product $\Delta n d$ of a refractive index anisotropy $\Delta n$ of the optically anisotropic layer measured at a wavelength of 550 nm and a thickness d of the optically anisotropic layer is 160 to 240 nm.

(3) The circularly polarizing plate according to (1), in which the polarizer, a second optically anisotropic layer, and a first optically anisotropic layer are provided in this order,
the first optically anisotropic layer is a layer formed by fixing a liquid crystal compound having reverse wavelength dispersibility twist-aligned with a thickness direction as a helical axis,
a molecular axis of the liquid crystal compound in the first optically anisotropic layer is horizontal to a surface of the first optically anisotropic layer,
the second optically anisotropic layer is a layer formed by fixing a liquid crystal compound having reverse wavelength dispersibility homogeneously aligned,
a twisted angle of the liquid crystal compound in the first optically anisotropic layer is in a range of 85°±20°,
an in-plane slow axis on a surface of the first optically anisotropic layer on a second optically anisotropic layer side is parallel to an in-plane slow axis on a surface of the second optically anisotropic layer on a first optically anisotropic layer side,
a value of a product $\Delta n_1 d_1$ of a refractive index anisotropy $\Delta n_1$ of the first optically anisotropic layer measured at a wavelength of 550 nm and a thickness $d_1$ of the first optically anisotropic layer satisfies a relationship of Expression (1) which will be described later, and
a value of a product $\Delta n_2 d_2$ of a refractive index anisotropy $\Delta n_2$ of the second optically anisotropic layer measured at a wavelength of 550 nm and a thickness $d_2$ of the second optically anisotropic layer satisfies a relationship of Expression (2) which will be described later.

(4) The circularly polarizing plate according to (1), in which the polarizer, a fourth optically anisotropic layer, and a third optically anisotropic layer are provided in this order,
the third optically anisotropic layer is a layer formed by fixing a liquid crystal compound having reverse wavelength dispersibility twist-aligned with a thickness direction as a helical axis,
a molecular axis of the liquid crystal compound in the third optically anisotropic layer is horizontal to a surface of the third optically anisotropic layer,
the fourth optically anisotropic layer is a layer formed by fixing a liquid crystal compound having reverse wavelength dispersibility twist-aligned with a thickness direction as a helical axis,
a molecular axis of the liquid crystal compound in the fourth optically anisotropic layer is horizontal to a surface of the fourth optically anisotropic layer, a twisted direction of the liquid crystal compound in the third optically anisotropic layer and a twisted direction of the liquid crystal compound in the fourth optically anisotropic layer are the same, a twisted angle of the liquid crystal compound in the fourth optically anisotropic layer is in a range of 26.5°±10.0°, a twisted angle of the liquid crystal compound in the third optically anisotropic layer is in a range of 78.6°±10.0°, an in-plane slow axis on a surface of the third optically anisotropic layer on a fourth optically anisotropic layer side is parallel to an in-plane slow axis on a surface of the fourth optically anisotropic layer on a third optically anisotropic layer side, and a value of a product $\Delta n3d3$ of a refractive index anisotropy $\Delta n3$ of the third optically anisotropic layer measured at a wavelength of 550 nm and a thickness d3 of the third optically anisotropic layer, and a value of a product $\Delta n4d4$ of a refractive index anisotropy $\Delta n4$ of the fourth optically anisotropic layer measured at a wavelength of 550 nm and a thickness d4 of the fourth optically anisotropic layer satisfy Expression (3) and Expression (4) which will be described later, respectively.

(5) The circularly polarizing plate according to any one of (1) to (4), in which the liquid crystal compound having reverse wavelength dispersibility is a rod-like liquid crystal compound having reverse wavelength dispersibility.

(6) An organic electroluminescent display device comprising the circularly polarizing plate according to any one of (1) to (5).

According to an aspect of the present invention, it is possible to provide a circularly polarizing plate with which, in a case where a display device obtained by disposing the circularly polarizing plate on a display element is viewed from an oblique direction while the direction thereof is being changed, the display device exhibits little change in tint and has a low reflectivity.

According to another aspect of the present invention, it is possible to provide an organic electroluminescent display device.

DESCRIPTION OF THE PREFERRED EMBODIMENTS

Figure 1:
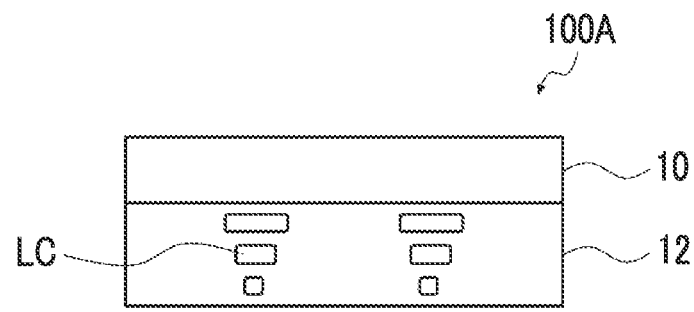
FIG. 1 is an example of a schematic cross-sectional view of a first embodiment of a circularly polarizing plate of the present invention.

Hereinafter, the present invention will be described in more detail. Any numerical range expressed using "to" in the present specification refers to a range including the numerical values before and after the "to" as a lower limit value and an upper limit value, respectively. First, the terms used in the present specification will be described.

The in-plane slow axis is defined at 550 nm unless otherwise specified.

In the present invention, Re($\lambda$) and Rth($\lambda$) represent an in-plane retardation at a wavelength $\lambda$ and a thickness direction retardation at a wavelength $\lambda$, respectively. Unless otherwise specified, the wavelength $\lambda$ is 550 nm.

In the present invention, Re($\lambda$) and Rth($\lambda$) are values measured at a wavelength of $\lambda$ in AxoScan (manufactured by Axometrics, Inc.). By inputting an average refractive index ((nx+ny+nz)/3) and a film thickness (d ($\mu m$)) in AxoScan, slow axis direction (°)

Re(λ)=R0(λ)

Rth(λ)=((nx+ny)/2−nz)×d are calculated.

Although R0(λ) is displayed as a numerical value calculated by AxoScan, it means Re(λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB).

The term "visible light" in the present specification refers to light in a wavelength range of 380 to 780 nm. In addition, the measurement wavelength in the present specification is 550 nm unless otherwise specified.

In addition, in the present specification, the relationship between angles (for example, "orthogonal" or "parallel") is intended to include a range of errors acceptable in the art to which the present invention belongs. Specifically, it means that an angle is within an error range of ±10° with respect to the exact angle, and the error with respect to the exact angle is preferably within a range of ±5° and more preferably within a range of ±3° or less.

The circularly polarizing plate according to the embodiment of the present invention is a circularly polarizing plate having a polarizer and an optically anisotropic layer, in which the optically anisotropic layer is a layer formed by fixing a liquid crystal compound having reverse wavelength dispersibility twist-aligned with a thickness direction as a helical axis, the molecular axis of the liquid crystal compound in the optically anisotropic layer is horizontal to the surface of the optically anisotropic layer, and the twisted angle of the twist-aligned liquid crystal compound is 15° to 360°.

The "horizontal" means that a tilt angle formed by an average molecular axis of the liquid crystal compound in the optically anisotropic layer with respect to a surface of the optically anisotropic layer is less than 20°. The tilt angle formed by the average molecular axis of the liquid crystal compound with respect to the surface of the optically anisotropic layer is measured using an AxoScan (polarimeter) device of Axometrics, Inc. and using device analysis software of Axometrics, Inc.

The present inventors have found that the effect of the present invention can be obtained by using an optically anisotropic layer formed by fixing a liquid crystal compound having reverse wavelength dispersibility and having a twisted angle in a predetermined range.

Hereinafter, specific embodiments of the circularly polarizing plate according to the embodiment of the present invention will be described in detail.

First Embodiment

A first embodiment of the circularly polarizing plate according to the embodiment of the present invention will be described with reference to the accompanying drawings. FIG. 1 shows a schematic cross-sectional view of the first embodiment of the circularly polarizing plate according to the embodiment of the present invention.

A circularly polarizing plate 100A has a polarizer 10 and an optically anisotropic layer 12. The optically anisotropic layer 12 is a layer formed of a rod-like liquid crystal compound LC. The optically anisotropic layer 12 is a layer formed by fixing the rod-like liquid crystal compound LC twist-aligned with a thickness direction as a helical axis, and the molecular axis of the rod-like liquid crystal compound LC in the optically anisotropic layer 12 is horizontal to the surface of the optically anisotropic layer 12. That is, the rod-like liquid crystal compound LC shown in the optically anisotropic layer 12 is twist-aligned in the optically anisotropic layer 12. In FIG. 1, a rod-like liquid crystal compound is used for forming the optically anisotropic layer 12, but, as will be described later, the liquid crystal compound is not limited to the rod-like liquid crystal compound.

In the circularly polarizing plate 100A, only the optically anisotropic layer 12 is included as an optically anisotropic layer formed of a liquid crystal compound. That is, in the circularly polarizing plate 100A, the optically anisotropic layer formed of a liquid crystal compound has a monolayer structure, and therefore only the optically anisotropic layer 12 which is a single layer is included as the optically anisotropic layer formed of a liquid crystal compound.

Hereinafter, each layer will be described in detail.

(Polarizer 10)

The polarizer 10 (linear polarizer) may be a member having a function of converting natural light into specific linearly polarized light and may be, for example, an absorption type polarizer.

The type of the polarizer 10 is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be disposed on one surface or both surfaces of the polarizer 10.

(Optically Anisotropic Layer 12)

The optically anisotropic layer 12 is a layer formed by fixing a liquid crystal compound twist-aligned with a thickness direction as a helical axis, and the molecular axis of the liquid crystal compound in the optically anisotropic layer 12 is horizontal to the surface of the optically anisotropic layer 12.

In the present specification, the liquid crystal compound having reverse wavelength dispersibility refers to a liquid crystal compound in which an in-plane retardation (Re) value corresponds to or is higher than an increase in a measurement wavelength in a case where the Re value at a specific wavelength (visible light range) of an optically anisotropic layer prepared using only this compound as the liquid crystal compound is measured.

In addition, in the present specification, the expression "the molecular axis is horizontal to the surface of the optically anisotropic layer" means that, as described above, the tilt angle formed by the average molecular axis of the liquid crystal compound with respect to the surface of the optically anisotropic layer is less than 20°. The method for measuring the tilt angle is as described above.

In addition, in the present specification, the "molecular axis" means a major axis (molecular major axis) in a case where the liquid crystal compound is a rod-like liquid crystal compound, and means an axis parallel to a normal direction with respect to a disc plane of a disk-like liquid crystal compound in a case where the liquid crystal compound is the disk-like liquid crystal compound.

The optically anisotropic layer 12 is preferably a layer formed by fixing a so-called chiral nematic phase having a helical structure. That is, the optically anisotropic layer 12 is preferably a layer formed by fixing a liquid crystal compound that is twist-aligned with a thickness direction as a helical axis and whose molecular axis is horizontally aligned. In a case of forming the above phase, it is preferable to use a mixture of a liquid crystal compound exhibiting a nematic liquid crystal phase and a chiral agent which will be described later.

In the present specification, the "fixed" state is a state in which the alignment of a liquid crystal compound is maintained. Specifically, the "fixed" state is preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

The twisted angle of the liquid crystal compound (the twisted angle of the alignment direction of the rod-like liquid crystal compound LC) in the optically anisotropic layer 12 is preferably in a range of 64°±20°. That is, the twisted angle of the liquid crystal compound is preferably 44° to 84°. In particular, the twisted angle of the liquid crystal compound is preferably 54° to 74° and more preferably 59° to 69°, from the viewpoint that, in a case where a display device obtained by disposing a circularly polarizing plate on a display element is viewed from an oblique direction while the direction thereof is being changed, the display device exhibits a smaller change in tint and/or has a lower reflectivity (hereinafter, also simply referred to as "the viewpoint that the effect of the present invention is more excellent").

The expression "the liquid crystal compound is twist-aligned" is intended to mean that the liquid crystal compound from one main surface to the other main surface of the optically anisotropic layer 12 is twisted around the thickness direction of the optically anisotropic layer 12 as an axis. Along with this, the alignment direction (in-plane slow axis direction) of the liquid crystal compound varies depending on the position in the thickness direction of the optically anisotropic layer 12.

In addition, there are two types of twisted directions, but it does not matter whether the twisted direction is right-handed or left-handed. In FIG. 1, the right-handed twist means that the in-plane slow axis on the side of the optically anisotropic layer 12 opposite to the polarizer 10 side is positioned clockwise with respect to the in-plane slow axis on the surface of the optically anisotropic layer 12 on the polarizer 10 side serving as a reference axis upon observation from the polarizer 10 toward the optically anisotropic layer 12.

The twisted angle is measured using an AxoScan (polarimeter) device of Axometrics, Inc. and using device analysis software of Axometrics, Inc.

From the viewpoint that the effect of the present invention is more excellent, the value of the product $\Delta nd$ of the refractive index anisotropy $\Delta n$ of the optically anisotropic layer 12 measured at a wavelength of 550 nm and the thickness d of the optically anisotropic layer 12 is preferably 160 to 240 nm, more preferably 170 to 230 nm, still more preferably 180 to 220 nm, and particularly preferably 190 to 210 nm.

The $\Delta nd$ is measured in the same manner as in the method for measuring the twisted angle using an AxoScan (polarimeter) device of Axometrics, Inc. and using device analysis software of Axometrics, Inc.

The thickness of the optically anisotropic layer 12 is not particularly limited, and is preferably 10 μm or less, more preferably 0.5 to 8.0 μm, and still more preferably 0.5 to 6.0 μm from the viewpoint of reducing the thickness.

In the present specification, the thickness of the optically anisotropic layer means an average thickness of the optically anisotropic layer. The average thickness is obtained by measuring the thicknesses of any five or more points of the optically anisotropic layer and arithmetically averaging the measured values.

It is preferable that the in-plane slow axis on the surface of the optically anisotropic layer 12 on the polarizer 10 side and the absorption axis of the polarizer 10 are parallel to each other. The definition of the "parallel" is as described above. That is, the angle formed by the in-plane slow axis on the surface of the optically anisotropic layer 12 on the polarizer 10 side and the absorption axis of the polarizer 10 is preferably within 10° (0° to 10°). In particular, from the viewpoint that the effect of the present invention is more excellent, the angle formed by the in-plane slow axis on the surface of the optically anisotropic layer 12 on the polarizer 10 side and the absorption axis of the polarizer 10 is more preferably less than 5° (0° or more and less than) 5°.

As described above, in FIG. 1, a rod-like liquid crystal compound is used for forming the optically anisotropic layer 12, but the present invention is not limited to this aspect.

Generally, the liquid crystal compound can be classified into a rod-like type (rod-like liquid crystal compound) and a disk-like type (disk-like liquid crystal compound) depending on the shape thereof. Furthermore, there are a low molecular weight type and a high molecular weight type for each of the rod-like type liquid crystal compound and the disk-like type liquid crystal compound. The high molecular weight generally refers to having a polymerization degree of 100 or more (Polymer Physics-Phase Transition Dynamics, Masao Doi, p. 2, Iwanami Shoten Publishers, 1992). Any liquid crystal compound can be used in the present invention. In addition, in the present invention, two or more rod-like liquid crystal compounds, two or more disk-like liquid crystal compounds, or a mixture of a rod-like liquid crystal compound and a disk-like liquid crystal compound may be used.

Examples of the rod-like liquid crystal compound include the liquid crystal compounds described in claim 1 of JP1999-513019A (JP-H11-513019A) and paragraphs [0026] to [0098] of JP2005-289980A. Examples of the disk-like liquid crystal compound include the liquid crystal compounds described in paragraphs [0020] to [0067] of JP2007-108732A and paragraphs [0013] to [0108] of JP2010-244038A.

The optically anisotropic layer 12 is more preferably formed of a liquid crystal compound having a polymerizable group and having reverse wavelength dispersibility (hereinafter, also simply referred to as a "polymerizable liquid crystal compound") since a change in temperature or a change in humidity can be reduced.

That is, the optically anisotropic layer 12 is preferably a layer formed by fixing a liquid crystal compound having a polymerizable group and having a reverse wavelength dispersibility by polymerization or the like.

The type of the polymerizable group is not particularly limited, and is preferably a functional group capable of an addition polymerization reaction, more preferably a polymerizable ethylenic unsaturated group or a ring-polymerizable group, still more preferably a (meth)acryloyl group, a vinyl group, a styryl group, or an allyl group, and particularly preferably a (meth)acryloyl group.

A polymerizable liquid crystal compound represented by Formula (I) is preferable as the polymerizable liquid crystal compound.

$L_1$-$G_1$-$D_1$-Ar-$D_2$-$G_2$-$L_2$        (I)

In Formula (I), $D_1$ and $D_2$ each independently represent a single bond, —O—, —CO—, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, CO—CR$^1$R$^2$—, —CR$^1$R$^2$—CR$^3$R$^4$—O—CO—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—.

$R^1$, $R^2$, $R^3$, and $R^4$ each independently represent a hydrogen atom, a fluorine atom, or an alkyl group having 1 to 4 carbon atoms. In a case where there are a plurality of each of $R^1$'s, $R^2$'s, $R^3$'s, and $R^4$'s, the plurality of $R^1$'s, the plurality of $R^2$'s, the plurality of $R^3$'s, and the plurality of $R^4$'s each may be the same as or different from each other.

$G_1$ and $G_2$ each independently represent a divalent alicyclic hydrocarbon group having 5 to 8 carbon atoms, a group in which a plurality of the alicyclic hydrocarbon groups are linked, an aromatic hydrocarbon group, or a group in which a plurality of the aromatic hydrocarbon groups are linked, and the methylene group contained in the alicyclic hydrocarbon group may be substituted with —O—, —S—, or —NH—.

The group in which a plurality of the alicyclic hydrocarbon groups are linked means a group in which divalent alicyclic hydrocarbon groups having 5 to 8 carbon atoms are linked by a single bond. In addition, the group in which a plurality of the aromatic hydrocarbon groups are linked means a group in which aromatic hydrocarbon groups are linked by a single bond.

$L_1$ and $L_2$ each independently represent a monovalent organic group, and at least one selected from the group consisting of $L_1$ and $L_2$ represents a monovalent group having a polymerizable group.

Ar represents any aromatic ring selected from the group consisting of groups represented by Formula (Ar-1) to Formula (Ar-7).

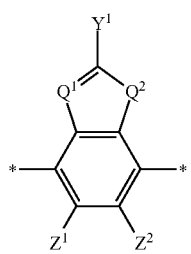
(Ar-1)

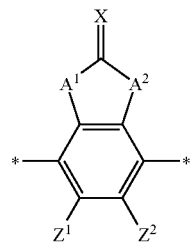
(Ar-2)

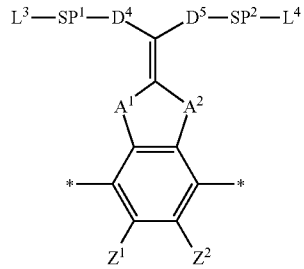
(Ar-3)

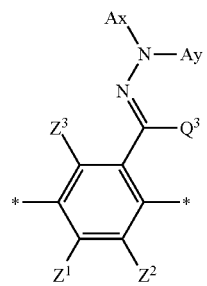
(Ar-4)

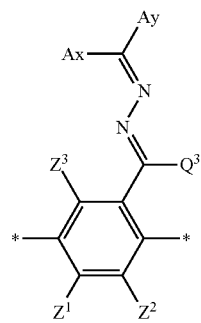
(Ar-5)

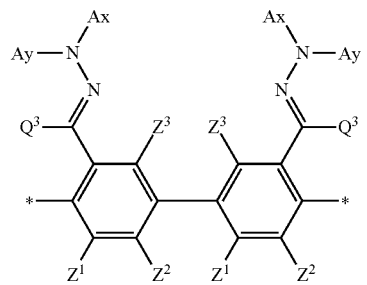
(Ar-6)

-continued

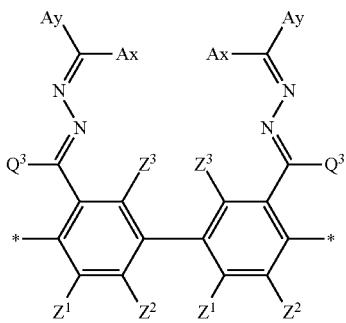

(Ar-7)

In Formula (Ar-1), Q¹ represents N or CH, Q² represents —S—, —O—, or —N(R⁷)—, represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Examples of the alkyl group having 1 to 6 carbon atoms represented by $R^7$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups of a phenyl group, a 2,6-diethylphenyl group, and a naphthyl group.

Examples of the aromatic heterocyclic group having 3 to 12 carbon atoms represented by $Y^1$ include heteroaryl groups of a thienyl group, a thiazolyl group, a furyl group, and a pyridyl group.

In addition, examples of the substituent that $Y^1$ may have include an alkyl group, an alkoxy group, and a halogen atom.

The alkyl group is preferably an alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group), still more preferably an alkyl group having 1 to 4 carbon atoms, and particularly preferably a methyl group or an ethyl group. The alkyl group may be linear, branched, or cyclic.

The alkoxy group is, for example, preferably an alkoxy group having 1 to 18 carbon atoms, more preferably an alkoxy group having 1 to 8 carbon atoms (for example, a methoxy group, an ethoxy group, an n-butoxy group, or a methoxyethoxy group), still more preferably an alkoxy group having 1 to 4 carbon atoms, and particularly preferably a methoxy group or an ethoxy group.

Examples of the halogen atom include a fluorine atom, a chlorine atom, a bromine atom, and an iodine atom, among which a fluorine atom or a chlorine atom is preferable.

In addition, in Formula (Ar-1) to Formula (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^8$, —$NR^9R^{10}$, or —$SR^{11}$, $R^8$ to $R^{11}$ each independently represent a hydrogen atom or an alkyl group having 1 to 6 carbon atoms, and $Z^1$ and $Z^2$ may be bonded to each other to form an aromatic ring.

The monovalent aliphatic hydrocarbon group having 1 to 20 carbon atoms is preferably an alkyl group having 1 to 15 carbon atoms, more preferably an alkyl group having 1 to 8 carbon atoms, still more preferably a methyl group, an ethyl group, an isopropyl group, a tert-pentyl group (1,1-dimethylpropyl group), a tert-butyl group, or a 1,1-dimethyl-3,3-dimethyl-butyl group, and particularly preferably a methyl group, an ethyl group, or a tert-butyl group.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, among which an aryl group having 6 to 12 carbon atoms (particularly, a phenyl group) is preferable.

Examples of the halogen atom include a fluorine atom, a chlorine atom, a bromine atom, and an iodine atom, among which a fluorine atom, a chlorine atom, or a bromine atom is preferable.

Examples of the alkyl group having 1 to 6 carbon atoms represented by $R^8$ to RH include a methyl group, an ethyl group, a propyl group, an isopropyl group, an n-butyl group, an isobutyl group, a sec-butyl group, a tert-butyl group, an n-pentyl group, and an n-hexyl group.

In addition, in Formula (Ar-2) and Formula (Ar-3), $A^1$ and $A^2$ each independently represent a group selected from the group consisting of —O—, —$N(R^{12})$—, —S—, and —CO—, and $R^{12}$ represents a hydrogen atom or a substituent.

Examples of the substituent represented by $R^{12}$ include the same substituents that $Y^1$ in Formula (Ar-1) may have.

In addition, in Formula (Ar-2), X represents a non-metal atom of Group 14 to Group 16. A hydrogen atom or a substituent may be bonded to the non-metal atom.

In addition, examples of the non-metal atom of Group 14 to Group 16 represented by X include an oxygen atom, a sulfur atom, a nitrogen atom having a substituent, and a carbon atom having a substituent (*=C—(R)₂ where * represents a bonding position and R represents a substituent), in which examples of the substituent include an alkyl group, an alkoxy group, an alkyl-substituted alkoxy group, a cyclic alkyl group, an aryl group (for example, a phenyl group or a naphthyl group), a cyano group, an amino group, a nitro group, an alkylcarbonyl group, a sulfo group, and a hydroxyl group.

In addition, in Formula (Ar-3), $D^4$ and $D^5$ each independently represent a single bond, or —CO—, —O—, —S—, —C(=S)—, —$CR^{1a}R^{2a}$—, —$CR^{3a}$=$CR^{4a}$—, —$NR^{5a}$— or a divalent linking group consisting of a combination of two or more thereof, and $R^{1a}$ to $R^{5a}$ each independently represent a hydrogen atom, a fluorine atom, or an alkyl group having 1 to 4 carbon atoms.

Here, examples of the divalent linking group include —CO—, —O—, —CO—O—, —C(=S)O—, —CR$^{1b}$R$^{2b}$—, —CR$^{1b}$R$^{2b}$—CR$^{1b}$R$^{2b}$—, —O—CR$^{1b}$R$^{2b}$—, —CR$^{1b}$R$^{2b}$—O—CR$^{1b}$R$^{2b}$—, —CO—O—CR$^{1b}$R$^{2b}$—, —O—CO—CR$^{1b}$R$^{2b}$—, —CR$^{1b}$R$^{2b}$—O—CO—CR$^{1b}$R$^{2b}$—, —CR$^{1b}$R$^{2b}$—CO—O—CR$^{1b}$R$^{2b}$—, —NR$^{3b}$—CR$^{1b}$R$^{2b}$—, and —CO—NR$^{3b}$—. R$^{1b}$, R$^{2b}$, and R$^{3b}$ each independently represent a hydrogen atom, a fluorine atom, or an alkyl group having 1 to 4 carbon atoms.

In addition, in Formula (Ar-3), SP$^1$ and SP$^2$ each independently represent a single bond, a linear or branched alkylene group having 1 to 12 carbon atoms, or a divalent linking group in which one or more of —CH$_2$— constituting a linear or branched alkylene group having 1 to 12 carbon atoms are substituted with —O—, —S—, —NH—, —N(Q)-, or —CO—, and Q represents a substituent. Examples of the substituent include the same substituents that Y$^1$ in Formula (Ar-1) may have.

Here, the linear or branched alkylene group having 1 to 12 carbon atoms is preferably, for example, a methylene group, an ethylene group, a propylene group, a butylene group, a pentylene group, a hexylene group, a methylhexylene group, or a heptylene group.

In addition, in Formula (Ar-3), L$^3$ and L$^4$ each independently represent a monovalent organic group.

Examples of the monovalent organic group include an alkyl group, an aryl group, and a heteroaryl group. The alkyl group may be linear, branched, or cyclic and is preferably linear. The number of carbon atoms in the alkyl group is preferably 1 to 30, more preferably 1 to 20, and still more preferably 1 to 10. In addition, the aryl group may be monocyclic or polycyclic and is preferably monocyclic. The number of carbon atoms in the aryl group is preferably 6 to 25 and more preferably 6 to 10. In addition, the heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms in the heteroaryl group is preferably 6 to 18 and more preferably 6 to 12. In addition, the alkyl group, the aryl group, and the heteroaryl group may be unsubstituted or may have a substituent. Examples of the substituent include the same substituents that Y$^1$ in Formula (Ar-1) may have.

In addition, in Formula (Ar-4) to Formula (Ar-7), Ax represents an organic group having 2 to 30 carbon atoms which has at least one aromatic ring selected from the group consisting of an aromatic hydrocarbon ring and an aromatic heterocyclic ring.

In addition, in Formula (Ar-4) to Formula (Ar-7), Ay represents a hydrogen atom, an alkyl group having 1 to 12 carbon atoms which may have a substituent, or an organic group having 2 to 30 carbon atoms which has at least one aromatic ring selected from the group consisting of an aromatic hydrocarbon ring and an aromatic heterocyclic ring.

Here, the aromatic rings in Ax and Ay may have a substituent, and Ax and Ay may be bonded to each other to form a ring.

In addition, Q$^3$ represents a hydrogen atom or an alkyl group having 1 to 6 carbon atoms which may have a substituent.

Examples of Ax and Ay include those described in paragraphs [0039] to [0095] of WO2014/010325A.

In addition, examples of the alkyl group having 1 to 6 carbon atoms represented by Q$^3$ include a methyl group, an ethyl group, a propyl group, an isopropyl group, an n-butyl group, an isobutyl group, a sec-butyl group, a tert-butyl group, an N-pentyl group, and an n-hexyl group, and examples of the substituent include the same substituents that Y$^1$ in Formula (Ar-1) may have.

With regard to the definition and preferred range of each substituent of the liquid crystal compound represented by Formula (III), the descriptions regarding D$^1$, D$^2$, G$^1$, G$^2$, L$^1$, L$^2$, R$^4$, R$^5$, R$^6$, R$^7$, X$^1$, Y$^1$, Q$^1$, and Q$^2$ for Compound (A) described in JP2012-021068A can be referred to for D$_1$, D$_2$, G$_1$, G$_2$, L$_1$, L$_2$, R$^1$, R$^2$, R$^3$, R$^4$, Q$_1$, Y$_1$, Z$_1$, and Z$_2$, respectively; the descriptions regarding A$_1$, A$_2$, and X for the compound represented by General Formula (I) described in JP2008-107767A can be referred to for A$_1$, A$_2$, and X, respectively; and the descriptions regarding Ax, Ay, and Q$^1$ for the compound represented by General Formula (I) described in WO 2013/018526A can be referred to for Ax, Ay, and Q$^3$, respectively. The description of Q$^1$ for Compound (A) described in JP2012-021068A can be referred to for Z$_3$.

In particular, the organic groups represented by L$_1$ and L$_2$ are each preferably a group represented by *-D$_3$-G$_3$-Sp-P$_3$. * represents a bonding position.

D$_3$ has the same definition as in D$_1$.

G$_3$ represents a single bond, a divalent aromatic ring group or heterocyclic group having 6 to 12 carbon atoms, a group in which a plurality of the aromatic ring groups or heterocyclic groups are linked, a divalent alicyclic hydrocarbon group having 5 to 8 carbon atoms, or a group in which a plurality of the alicyclic hydrocarbon groups are linked, and the methylene group contained in the alicyclic hydrocarbon group may be substituted with —O—, —S—, or —NR'— where R$^7$ represents a hydrogen atom or an alkyl group having 1 to 6 carbon atoms.

The group in which a plurality of the aromatic ring groups or heterocyclic groups are linked means a group in which divalent aromatic ring groups or heterocyclic groups having 6 to 12 carbon atoms are linked by a single bond. In addition, the group in which a plurality of the alicyclic hydrocarbon groups are linked means a group in which divalent alicyclic hydrocarbon groups having 5 to 8 carbon atoms are linked by a single bond.

G$_3$ is also preferably a group in which two cyclohexane rings are bonded through a single bond.

Sp represents a spacer group represented by a single bond, —(CH$_2$)$_n$—, —(CH$_2$)$_n$O—, —(CH$_2$—O—)$_n$—, —(CH$_2$CH$_2$—O—)$_m$, —O—(CH$_2$)$_n$—, —O—(CH$_2$)$_n$O—, —O—(CH$_2$—O—)$_n$—, —O—(CH$_2$CH$_2$—O—)$_m$, —C(=O)—O—(CH$_2$)$_n$—, —C(=O)—O—(CH$_2$)$_n$—O—, —C(=O)—O—(CH$_2$—O—)$_n$—, —C(=O)—O—(CH$_2$CH$_2$—O—)$_m$, —C(=O)—N(R$^8$)—(CH$_2$)$_n$—, —C(=O)—N(R$^8$)—(CH$_2$)$_n$—O—, —C(=O)—N(R$^8$)—(CH$_2$—O—)$_n$—, —C(=O)—N(R$^8$)—(CH$_2$CH$_2$—O—)$_m$, or —(CH$_2$)$_n$—O—(C=O)—(CH$_2$)$_n$—C(=O)—O—(CH$_2$)$_n$—. Here, n represents an integer of 2 to 12, m represents an integer of 2 to 6, and R$^8$ represents a hydrogen atom or an alkyl group having 1 to 6 carbon atoms. In addition, the hydrogen atom of —CH$_2$— in each of the above groups may be substituted with a methyl group.

P$_3$ represents a polymerizable group.

The polymerizable group is not particularly limited and is preferably a polymerizable group capable of radical polymerization or cationic polymerization.

Examples of the radically polymerizable group include known radically polymerizable groups, among which an acryloyl group or a methacryloyl group is preferable. The acryloyl group is generally known to have a high polymerization rate and therefore the acryloyl group is preferable from the viewpoint of improving productivity; whereas the methacryloyl group can also be used as the polymerizable group of a highly birefringent liquid crystal.

Examples of the cationically polymerizable group include known cationically polymerizable groups, examples of which include an alicyclic ether group, a cyclic acetal group, a cyclic lactone group, a cyclic thioether group, a spiroorthoester group, and a vinyloxy group. Among these groups, an alicyclic ether group or a vinyloxy group is preferable, and an epoxy group, an oxetanyl group, or a vinyloxy group is more preferable.

Particularly preferred examples of the polymerizable group include the following.

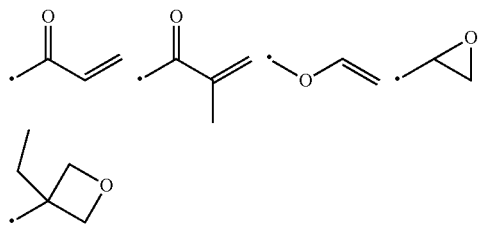

In the present specification, the "alkyl group" may be linear, branched, or cyclic, and examples thereof include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethylpropyl group, an n-hexyl group, an isohexyl group, a cyclopropyl group, a cyclobutyl group, a cyclopentyl group, and a cyclohexyl group.

The method for producing the optically anisotropic layer 12 is not particularly limited, and is preferably a method using a composition containing a polymerizable liquid crystal compound (for example, a rod-like liquid crystal compound having a polymerizable group and having reverse wavelength dispersibility) (hereinafter, also simply referred to as a "polymerizable liquid crystal composition").

Hereinafter, the method using a polymerizable liquid crystal composition will be described in detail.

The polymerizable liquid crystal composition contains the above-described polymerizable liquid crystal compound.

The polymerizable liquid crystal composition may contain a component other than the polymerizable liquid crystal compound. The other component may be, for example, a polymerization initiator. The polymerization initiator used is selected according to the type of polymerization reaction, and examples thereof include a thermal polymerization initiator and a photopolymerization initiator.

The content of the polymerization initiator in the polymerizable liquid crystal composition is preferably 0.01% to 20% by mass and more preferably 0.5% to 10% by mass with respect to the total solid content of the composition.

The solid content means a component capable of forming an optically anisotropic layer from which a solvent has been removed, and even in a case where a component itself is in a liquid state, such a component is regarded as the solid content.

The polymerizable liquid crystal composition may contain a polymerizable monomer other than the liquid crystal compound having a polymerizable group. Examples of the polymerizable monomer include radically polymerizable or cationically polymerizable compounds, among which a polyfunctional radically polymerizable monomer is preferable.

The content of the polymerizable monomer in the polymerizable liquid crystal composition is preferably 1% to 50% by mass and more preferably 2% to 30% by mass with respect to the total mass of the liquid crystal compound.

Examples of other components that may be contained in the polymerizable liquid crystal composition include a surfactant, an adhesion improver, a plasticizer, and a solvent, in addition to the foregoing components.

The polymerizable liquid crystal composition preferably contains a chiral agent in order to twist-align a polymerizable liquid crystal compound. The chiral agent is added to twist-align the polymerizable liquid crystal compound, but of course, it is not necessary to add the chiral agent in a case where the liquid crystal compound is a compound exhibiting an optical activity such as having an asymmetric carbon in a molecule. In addition, addition of the chiral agent may not be necessary depending on the production method and the twisted angle.

The chiral agent is not particularly limited in a structure thereof as long as it is compatible with the polymerizable liquid crystal compound used in combination. Any of known chiral agents (for example, those described in "Liquid Crystal Device Handbook" edited by the 142nd Committee of the Japan Society for the Promotion of Science, Chapter 3, 4-3, Chiral agents for TN and STN, p. 199, 1989) can be used.

The amount of the chiral agent used is not particularly limited and is adjusted such that the above-mentioned twisted angle is achieved.

In addition, in order to tilt the liquid crystal compound, it is preferable that the polymerizable liquid crystal composition contains an alignment control agent (a vertical alignment agent or a horizontal alignment agent).

A known compound can be used as the alignment control agent.

As the method for preparing the optically anisotropic layer 12, for example, there is a method in which a polymerizable liquid crystal composition is applied to form a coating film, the coating film is subjected to an alignment treatment to align a polymerizable liquid crystal compound, and a curing treatment is carried out.

The object onto which the polymerizable liquid crystal composition is applied is not particularly limited, and examples thereof include a support which will be described later and the above-described polarizer.

The object onto which the polymerizable liquid crystal composition is applied may be subjected to a rubbing treatment in order to bring the direction of the in-plane slow axis of the formed optically anisotropic layer into a predetermined direction. For example, a support that has been subjected to a rubbing treatment may be used.

Examples of the method of applying the polymerizable liquid crystal composition include a curtain coating method, a dip coating method, a spin coating method, a printing coating method, a spray coating method, a slot coating method, a roll coating method, a slide coating method, a blade coating method, a gravure coating method, and a wire bar method.

Next, the formed coating film is subjected to an alignment treatment to align a polymerizable liquid crystal compound in the coating film.

The alignment treatment can be carried out by drying the coating film at room temperature or by heating the coating film. In a case of a thermotropic liquid crystal compound, the liquid crystal phase formed by the alignment treatment can generally be transferred by a change in temperature or pressure. In a case of a lyotropic liquid crystal compound, the liquid crystal phase formed by the alignment treatment can also be transferred by a compositional ratio such as an amount of solvent.

The conditions in a case of heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later. The cooling temperature is preferably 20° C. to 200° C. and more preferably 30° C. to 150° C.

Next, the coating film in which the polymerizable liquid crystal compound is aligned is subjected to a curing treatment.

The method of the curing treatment carried out on the coating film in which the polymerizable liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 mJ/cm$^2$ is preferable.

The atmosphere during the light irradiation treatment is not particularly limited and is preferably a nitrogen atmosphere.

(Other Layers)

The circularly polarizing plate 100A may have a layer other than the above-described polarizer 10 and optically anisotropic layer 12.

The circularly polarizing plate 100A may have a support. The support does not correspond to an optically anisotropic layer formed of a liquid crystal compound.

The circularly polarizing plate 100A may have the support between the polarizer 10 and the optically anisotropic layer 12.

The support is preferably a transparent support. The transparent support is intended to refer to a support having a visible light transmittance of 60% or more, which preferably has a visible light transmittance of 80% or more and more preferably 90% or more.

The support may be an elongated support (long support). The length of the elongated support in a longitudinal direction is not particularly limited, and a support having a length of 10 m or more is preferable. From the viewpoint of productivity, a support having a length of 100 m or more is more preferable. The length in a longitudinal direction is not particularly limited, and is often 10,000 m or less.

The width of the elongated support is not particularly limited and is often 150 to 3,000 mm and preferably 300 to 2,000 mm.

A polymer having excellent optical performance transparency, mechanical strength, heat stability, moisture shielding property, isotropy, and the like is preferable as the material for forming the support.

Examples of the polymer film that can be used as the support include a cellulose acylate film (for example, a cellulose triacetate film, a cellulose diacetate film, a cellulose acetate butyrate film, and a cellulose acetate propionate film), a polyolefin film such as polyethylene or polypropylene, a polyester film such as polyethylene terephthalate or polyethylene naphthalate, a polyacrylic film such as polymethylmethacrylate, a polyether sulfone film, a polyurethane film, a polycarbonate film, a polysulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure.

The support may contain various additives (for example, an optical anisotropy adjuster, a wavelength dispersion adjuster, a fine particle, a plasticizer, an ultraviolet inhibitor, a deterioration inhibitor, and a release agent).

The thickness direction retardation value (Rth(550)) of the support at a wavelength of 550 nm is not particularly limited, and is preferably −110 to 110 nm and more preferably −80 to 80 nm.

The in-plane retardation value (Re(550)) of the support at a wavelength of 550 nm is not particularly limited, and is preferably 0 to 50 nm, more preferably 0 to 30 nm, and still more preferably 0 to 10 nm.

The thickness of the support is not particularly limited, and is preferably 10 to 200 μm, more preferably 10 to 100 μm, and still more preferably 20 to 90 μm.

In addition, the support may consist of a plurality of lamination layers.

In order to improve the adhesion of the support to the layer provided thereon, the surface of the support may be subjected to a surface treatment (for example, a glow discharge treatment, a corona discharge treatment, an ultraviolet (UV) treatment, or a flame treatment).

In addition, an adhesive layer (undercoat layer) may be provided on the support.

The support may be a so-called temporary support.

In addition, the surface of the support may be directly subjected to a rubbing treatment. That is, a support that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the support in a certain direction with paper, gauze, felt, rubber, nylon fiber, polyester fiber, or the like can be used.

The circularly polarizing plate 100A may have an alignment film.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett method (LB film).

Further, there is also known an alignment film capable of expressing an alignment function by application of an electric field, application of a magnetic field, or irradiation with light (preferably polarized light).

The alignment film is preferably formed by a rubbing treatment of a polymer.

The circularly polarizing plate 100A may have a pressure sensitive adhesive layer. In particular, the pressure sensitive adhesive layer may be provided on a surface of the optically anisotropic layer 12 opposite to the polarizer 10 side.

A known pressure sensitive adhesive is used as the pressure sensitive adhesive that constitutes the pressure sensitive adhesive layer.

Second Embodiment

Figure 2:
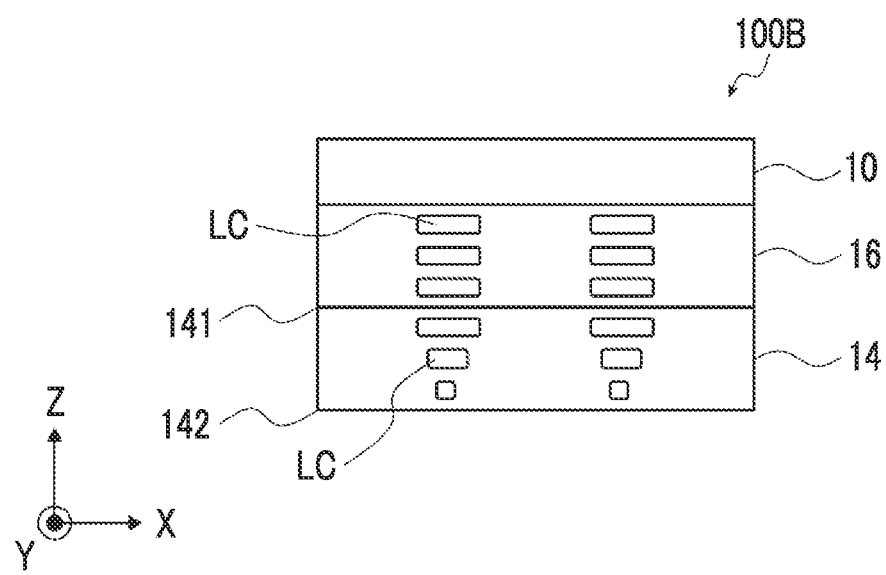
FIG. 2 is an example of a schematic cross-sectional view of a second embodiment of the circularly polarizing plate of the present invention.

A second embodiment of the circularly polarizing plate according to the embodiment of the present invention will be described with reference to the accompanying drawings. FIG. 2 shows a schematic cross-sectional view of the second embodiment of the circularly polarizing plate according to the embodiment of the present invention.

A circularly polarizing plate 100B has a polarizer 10, a second optically anisotropic layer 16, and a first optically anisotropic layer 14 in this order. Both the first optically anisotropic layer 14 and the second optically anisotropic layer 16 are layers formed of the rod-like liquid crystal compound LC. In particular, the first optically anisotropic layer 14 is a layer formed by fixing a liquid crystal compound having reverse wavelength dispersibility twist-aligned with a thickness direction as a helical axis, and the molecular axis of the rod-like liquid crystal compound LC in the first optically anisotropic layer is horizontal to the surface of the first optically anisotropic layer. That is, the rod-like liquid crystal compound LC shown in the first optically anisotropic layer 14 is twist-aligned in the first optically anisotropic layer 14.

In the circularly polarizing plate 100B, the optically anisotropic layer 14 and the second optically anisotropic layer 16 are included as optically anisotropic layers formed of a liquid crystal compound. That is, in the circularly polarizing plate 100B, the optically anisotropic layer has a multi-layer structure.

Hereinafter, each layer will be described in detail. The polarizer 10 is the same as the polarizer 10 described in the first embodiment described above, and therefore the description thereof will be omitted.

(First Optically Anisotropic Layer 14)

As shown in FIG. 2, the first optically anisotropic layer 14 is a layer formed by fixing the rod-like liquid crystal compound LC twist-aligned with a thickness direction (a z-axis direction in FIG. 1) as a helical axis, and the molecular axis of the rod-like liquid crystal compound LC in the first optically anisotropic layer 14 is horizontal to the surface of the first optically anisotropic layer 14. The first optically anisotropic layer 14 is preferably a layer formed by fixing a so-called chiral nematic phase having a helical structure. That is, the first optically anisotropic layer 14 is preferably a layer formed by fixing a liquid crystal compound that is twist-aligned with a thickness direction as a helical axis and whose molecular axis is horizontally aligned. In a case of forming the above phase, it is preferable to use a mixture of a liquid crystal compound exhibiting a nematic liquid crystal phase and a chiral agent which will be described later.

The meaning of the "fixed" state is as described above.

In addition, the definition that the molecular axis is horizontal to the surface of the optically anisotropic layer is as described in the first embodiment described above.

The twisted angle of the rod-like liquid crystal compound LC (the twisted angle of the alignment direction of the rod-like liquid crystal compound LC) is preferably in a range of 85°±20°. That is, the twisted angle is preferably 65° to 105°. Above all, the twisted angle is more preferably 75° to 95° and still more preferably 80° to 90°, from the viewpoint that the effect of the present invention is more excellent.

The expression "the liquid crystal compound is twist-aligned" is intended to mean that the liquid crystal compound from one main surface to the other main surface of the first optically anisotropic layer 14 is twisted around the thickness direction of the first optically anisotropic layer 14 as an axis. Along with this, the alignment direction (in-plane slow axis direction) of the liquid crystal compound varies depending on the position in the thickness direction of the first optically anisotropic layer 14.

In addition, there are two types of twisted directions, but it does not matter whether the twisted direction is right-handed or left-handed. In FIG. 2, the right-handed twist means that the in-plane slow axis on the side of the first optically anisotropic layer 14 opposite to the polarizer 10 side is positioned clockwise with respect to the in-plane slow axis on the surface of the first optically anisotropic layer 14 on the polarizer 10 side serving as a reference axis upon observation from the polarizer 10 toward the first optically anisotropic layer 14.

The twisted angle is measured using an AxoScan (polarimeter) device of Axometrics, Inc. and using device analysis software of Axometrics, Inc.

The value of the product $\Delta n$ of the refractive index anisotropy $\Delta n1$ of the first optically anisotropic layer 14 measured at a wavelength of 550 nm and the thickness $d1$ of the first optically anisotropic layer 14 preferably satisfies a relationship of Expression (1) from the viewpoint that the effect of the present invention is more excellent.

$$150 \text{ nm} \leq \Delta n1 d1 \leq 230 \text{ nm} \quad \text{Expression (1)}$$

Above all, the $\Delta n1 d1$ more preferably satisfies a relationship of Expression (1A), and still more preferably satisfies a relationship of Expression (1B).

$$160 \text{ nm} \leq \Delta n1 d1 \leq 220 \text{ nm} \quad \text{Expression (1A)}$$

$$170 \text{ nm} \leq \Delta n1 d1 \leq 210 \text{ nm} \quad \text{Expression (1B)}$$

The $\Delta n1 d1$ is measured in the same manner as in the method for measuring the twisted angle using an AxoScan (polarimeter) device of Axometrics, Inc. and using device analysis software of Axometrics, Inc.

(Second Optically Anisotropic Layer 16)

The second optically anisotropic layer 16 is a layer formed of the rod-like liquid crystal compound LC. More specifically, the second optically anisotropic layer 16 is a layer formed of a composition containing the rod-like liquid crystal compound LC.

Unlike the first optically anisotropic layer 14, the second optically anisotropic layer 16 is a layer formed by fixing a liquid crystal compound homogeneously aligned.

The meaning of the "fixed" state is as described above.

The homogeneous alignment in the present specification refers to a state in which a molecular axis of a liquid crystal compound (for example, a major axis in a case of a rod-like liquid crystal compound) is arranged horizontally and in the same direction with respect to the layer surface (optical uniaxiality).

Here, the "horizontal" does not require that the molecular axis of the liquid crystal compound is strictly horizontal with respect to the layer surface, but is intended to mean that the tilt angle formed by the average molecular axis of the liquid crystal compound in the layer with respect to the layer surface is less than 20°.

In addition, the same direction does not require that the molecular axis of the liquid crystal compound is arranged strictly in the same direction with respect to the layer surface, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The value of the product Δn2d2 of the refractive index anisotropy Δn2 of the second optically anisotropic layer 16 measured at a wavelength of 550 nm and the thickness d2 of the second optically anisotropic layer 16 preferably satisfies a relationship of Expression (2) from the viewpoint that the effect of the present invention is more excellent.

140 nm≤Δn2d2≤220 nm　　　Expression (2)

Above all, the Δn2d2 more preferably satisfies a relationship of Expression (2A), and still more preferably satisfies a relationship of Expression (2B).

180 nm≤Δn2d2≤220 nm　　　Expression (2A)

190 nm≤Δn2d2≤210 nm　　　Expression (2B)

The Δn2d2 is measured using an AxoScan (polarimeter) device of Axometrics, Inc. and using device analysis software of Axometrics, Inc.

The in-plane slow axis on the surface of the first optically anisotropic layer 14 on the second optically anisotropic layer 16 side is parallel to the in-plane slow axis on the surface of the second optically anisotropic layer 16 on the first optically anisotropic layer 14 side. The definition of the "parallel" is as described above. That is, the angle formed by the in-plane slow axis on the surface of the first optically anisotropic layer 14 on the second optically anisotropic layer 16 side with respect to the in-plane slow axis on the surface of the second optically anisotropic layer 16 on the first optically anisotropic layer 14 side is within 10° (0° to 10°).

An alignment film which will be described later may be disposed between the first optically anisotropic layer 14 and the second optically anisotropic layer 16 but, as shown in FIG. 2, it is preferable that the first optically anisotropic layer 14 and the second optically anisotropic layer 16 are adjacent to each other and substantially no alignment film is provided between the first optically anisotropic layer 14 and the second optically anisotropic layer 16. In a case where substantially no alignment film is provided between the first optically anisotropic layer 14 and the second optically anisotropic layer 16, covalent bonds between the compounds contained in the respective optically anisotropic layers can be utilized, resulting in more excellent adhesiveness.

In addition, as described above, the first optically anisotropic layer 14 contains the twist-aligned liquid crystal compound, and therefore a circularly polarizing plate can be obtained without carrying out a rubbing treatment. More specifically, in a case where the first optically anisotropic layer 14 is prepared and then the second optically anisotropic layer 16 is formed on the first optically anisotropic layer 14 using a liquid crystal compound, since the direction of the in-plane slow axis on a surface 141 of the first optically anisotropic layer 14 on the second optically anisotropic layer 16 side is different from the direction of the in-plane slow axis on a surface 142 of the first optically anisotropic layer 14 opposite to the second optically anisotropic layer 16 side, the liquid crystal compound is aligned along the alignment state of the surface 141 in a case where the liquid crystal compound is applied onto the surface 141 without carrying out the rubbing treatment, which makes it possible to obtain a desired optically anisotropic layer.

In FIG. 2, a rod-like liquid crystal compound is used for forming the first optically anisotropic layer 14 and the second optically anisotropic layer 16, but the present invention is not limited to this aspect.

An aspect of the liquid crystal compound having reverse wavelength dispersibility used for forming the first optically anisotropic layer 14 and the second optically anisotropic layer 16 is as described in the first embodiment described above.

In the circularly polarizing plate 100B, the relationship between the absorption axis of the polarizer 10 and the in-plane slow axis of the first optically anisotropic layer 14 and the second optically anisotropic layer 16 preferably satisfies the following requirement (Xa) or (Ya).

(Xa) The angle formed by the in-plane slow axis of the second optically anisotropic layer 16 and the absorption axis of the polarizer 10 is in a range of 13°±10° (3° to 23°) (preferably in a range of 13°±6° and more preferably in a range of 13°±3°).

(Ya) The angle formed by the in-plane slow axis of the second optically anisotropic layer 16 and the absorption axis of the polarizer 10 is in a range of 103°±10° (93° to 113°) (preferably in a range of 103°±6° and more preferably in a range of 103°±3°).

As described above, the in-plane slow axis on the surface of the first optically anisotropic layer 14 on the second optically anisotropic layer 16 side is parallel to the in-plane slow axis on the surface of the second optically anisotropic layer 16 on the first optically anisotropic layer 14 side.

The relationship among the absorption axis of the polarizer 10, the in-plane slow axis of the second optically anisotropic layer 16, and the in-plane slow axis of the first optically anisotropic layer 14 in the requirement represented by (Xa) will be described in more detail with reference to FIG. 3.

Figure 3:
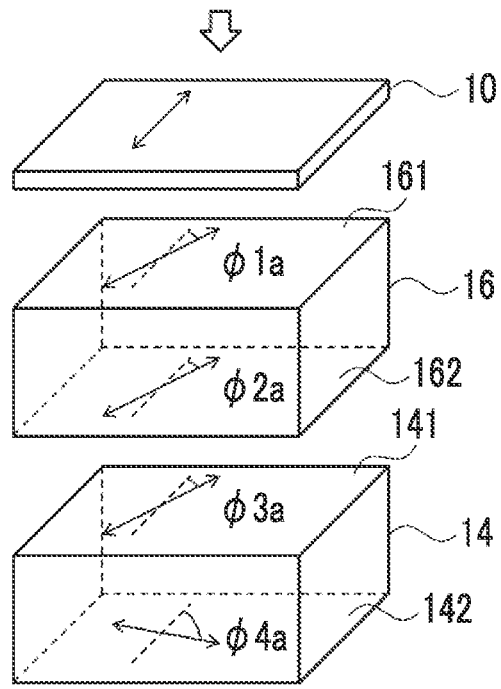
FIG. 3 is a view showing a relationship between an absorption axis of a polarizer 10 and an in-plane slow axis of each of a first optically anisotropic layer 14 and a second optically anisotropic layer 16 in one aspect of the second embodiment of the circularly polarizing plate of the present invention.

In FIG. 3, an arrow in the polarizer 10 represents an absorption axis, and an arrow in the second optically anisotropic layer 16 and the first optically anisotropic layer 14 represents an in-plane slow axis in each layer. In addition, FIG. 4 shows a relationship of the angle among the absorption axis of the polarizer 10, the in-plane slow axis of the second optically anisotropic layer 16, and the in-plane slow axis of the first optically anisotropic layer 14 upon observation from a white arrow in FIG. 3.

Figure 4:
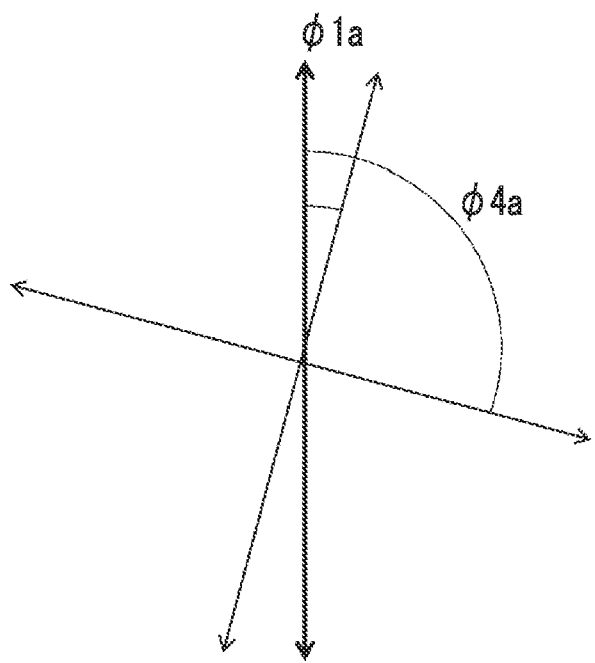
FIG. 4 is a schematic view showing a relationship of an angle between the absorption axis of the polarizer 10 and the in-plane slow axis of each of the first optically anisotropic layer 14 and the second optically anisotropic layer 16, upon observation from the direction of an arrow in FIG. 3.

The rotation angle of the in-plane slow axis in FIG. 4 is represented by a positive value in a counterclockwise direction and a negative value in a clockwise direction, with reference to the absorption axis of the polarizer 10, upon observation from the white arrow in FIG. 3.

In FIG. 3, an angle φ1a formed by the absorption axis of the polarizer 10 and the in-plane slow axis of the second optically anisotropic layer 16 is 13°. That is, the in-plane slow axis of the second optically anisotropic layer 16 is rotated by −13° (clockwise 13°) with respect to the absorption axis of the polarizer 10. Although FIG. 3 shows an aspect in which the in-plane slow axis of the second optically anisotropic layer 16 is at a position of −13°, the present invention is not limited to this aspect. The in-plane slow axis of the second optically anisotropic layer 16 may be in a range of −13°±10°.

In addition, as described above, the second optically anisotropic layer 16 has the same in-plane slow axis at both interfaces. That is, an angle φ2a formed by the absorption axis of the polarizer 10 and the in-plane slow axis on a surface 162 of the second optically anisotropic layer 16 on the first optically anisotropic layer 14 side is substantially the same as the φ1a.

In FIG. 3, the in-plane slow axis on the surface 162 of the second optically anisotropic layer 16 on the first optically anisotropic layer 14 side is parallel to the in-plane slow axis on the surface 141 of the first optically anisotropic layer 14 on the second optically anisotropic layer 16 side. That is, an angle φ3a formed by the absorption axis of the polarizer 10 and the in-plane slow axis on the surface 141 of the first optically anisotropic layer 14 on the second optically anisotropic layer 16 side is substantially the same as the φ1a.

The in-plane slow axis on the surface 141 of the first optically anisotropic layer 14 on the second optically anisotropic layer 16 side and the in-plane slow axis on the surface 142 of the first optically anisotropic layer 14 opposite to the second optically anisotropic layer 16 side form the above-described twisted angle. Here, taking a twisted angle of 85° as an example as shown in FIG. 3, the in-plane slow axis of the optically anisotropic layer 12 rotates by −85° (clockwise 85°). Therefore, an angle φ4a formed by the absorption axis of the polarizer 10 and the in-plane slow axis on the surface 142 of the first optically anisotropic layer 14 is 98°.

Although FIG. 3 shows an aspect in which the in-plane slow axis on the surface 142 of the first optically anisotropic layer 14 is rotated 85° clockwise with respect to the in-plane slow axis on the surface 141 of the first optically anisotropic layer 14, the present invention is not limited to this aspect. The rotation angle may be in a range of 65° to 105° in a clockwise direction.

As described above, in the aspect of FIG. 3, the in-plane slow axis of the second optically anisotropic layer 16 is at a position of 13° clockwise with reference to the absorption axis of the polarizer 10, and the twisted direction of the liquid crystal compound in the first optically anisotropic layer 14 is clockwise (right-handed twist). It should be noted that the twisted direction is determined to be right-handed twist or left-handed twist with reference to the in-plane slow axis on the surface (surface 141) of the first optically anisotropic layer 14 on the polarizer 10 side, upon observation from the white arrow in FIG. 3.

In FIG. 3, an aspect in which the in-plane slow axis of the second optically anisotropic layer 16 and the twisted direction of the liquid crystal compound in the first optically anisotropic layer 14 are clockwise has been described in detail, but a counterclockwise aspect may be configured as long as a predetermined angular relationship is satisfied. More specifically, it may be an aspect in which the in-plane slow axis of the second optically anisotropic layer 16 is at a position of 13° counterclockwise with reference to the absorption axis of the polarizer 10, and the twisted direction of the liquid crystal compound in the first optically anisotropic layer 14 is counterclockwise (left-handed twist).

Summarizing these aspects, in a case where the second optically anisotropic layer 16 is observed from the polarizer 10 and the counterclockwise direction is represented by a positive angle value, it is sufficient that, with the absorption axis of the polarizer 10 as a reference (0°), the in-plane slow axis of the second optically anisotropic layer 16 is in a range of 13°±10° and the twisted direction of the first optically anisotropic layer 14 is counterclockwise, or the in-plane slow axis of the second optically anisotropic layer 16 is in a range of −13°±10° and the twisted direction of the first optically anisotropic layer 14 is clockwise.

Next, the relationship among the absorption axis of the polarizer 10, the in-plane slow axis of the second optically anisotropic layer 16, and the in-plane slow axis of the first optically anisotropic layer 14 in the embodiment represented by (Ya) will be described in more detail with reference to FIG. 5.

Figure 5:
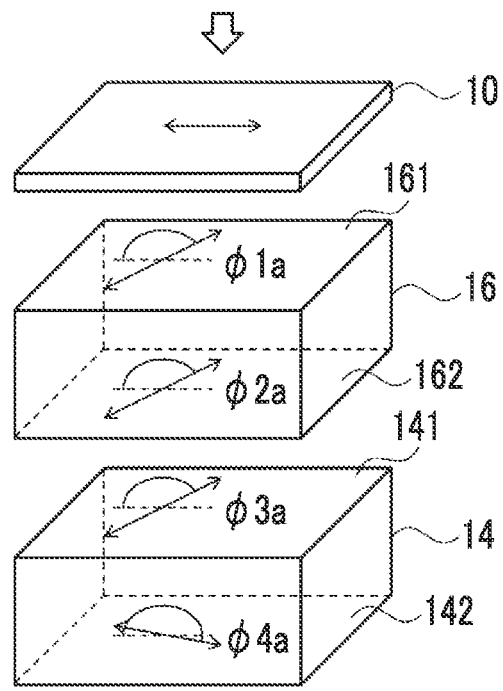
FIG. 5 is a view showing a relationship between the absorption axis of the polarizer 10 and the in-plane slow axis of each of the first optically anisotropic layer 14 and the second optically anisotropic layer 16 in one aspect of the second embodiment of the circularly polarizing plate of the present invention.

In FIG. 5, an arrow in the polarizer 10 represents an absorption axis, and an arrow in the second optically anisotropic layer 16 and the first optically anisotropic layer 14 represents an in-plane slow axis in each layer. In addition, FIG. 6 shows a relationship of the angle among the absorption axis of the polarizer 10, the in-plane slow axis of the second optically anisotropic layer 16, and the in-plane slow axis of the first optically anisotropic layer 14 upon observation from a white arrow in FIG. 5.

Figure 6:
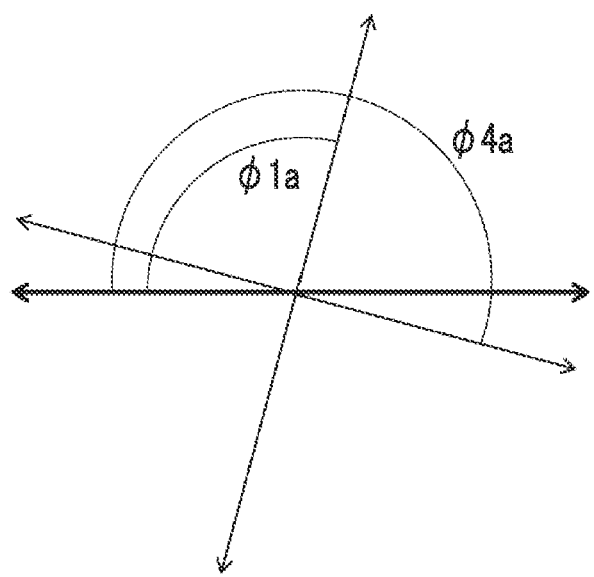
FIG. 6 is a schematic view showing a relationship of an angle between the absorption axis of the polarizer 10 and the in-plane slow axis of each of the first optically anisotropic layer 14 and the second optically anisotropic layer 16, upon observation from the direction of an arrow in FIG. 5.

The rotation angle of the in-plane slow axis in FIG. 6 is represented by a positive value in a counterclockwise direction and a negative value in a clockwise direction, with reference to the absorption axis of the polarizer 10, upon observation from the white arrow in FIG. 5.

The aspect shown in FIG. 5 has the same configuration as the aspect shown in FIG. 3 except that the absorption axis of the polarizer 10 differs from the absorption axis of the polarizer 10 in FIG. 5 by 90°.

In FIG. 5, the angle φ1a formed by the absorption axis of the polarizer 10 and the in-plane slow axis of the second optically anisotropic layer 16 is 103°. That is, the in-plane slow axis of the second optically anisotropic layer 16 is rotated by −103° (clockwise 103°) with respect to the absorption axis of the polarizer 10. Although FIG. 5 shows an aspect in which the in-plane slow axis of the second optically anisotropic layer 16 is at a position of −103°, the present invention is not limited to this aspect. The in-plane slow axis of the second optically anisotropic layer 16 may be in a range of −103°±10°.

In addition, as described above, the second optically anisotropic layer 16 has the same in-plane slow axis at both interfaces. That is, the angle φ2a formed by the absorption axis of the polarizer 10 and the in-plane slow axis on the surface 162 of the second optically anisotropic layer 16 on the first optically anisotropic layer 14 side is substantially the same as the φ1a.

In FIG. 5, similarly to FIG. 3, the in-plane slow axis on the surface 162 of the second optically anisotropic layer 16 on the first optically anisotropic layer 14 side is parallel to the in-plane slow axis on the surface 141 of the first optically anisotropic layer 14 on the second optically anisotropic layer 16 side. That is, an angle φ3a formed by the absorption axis of the polarizer 10 and the in-plane slow axis on the surface 141 of the first optically anisotropic layer 14 on the second optically anisotropic layer 16 side is substantially the same as the φ1a.

In FIG. 5, similarly to FIG. 3, the in-plane slow axis on the surface 141 of the first optically anisotropic layer 14 on the second optically anisotropic layer 16 side and the in-plane slow axis on the surface 142 of the first optically anisotropic layer 14 opposite to the second optically anisotropic layer 16 side form the above-described twisted angle. Here, taking a twisted angle of 85° as an example as shown in FIG. 3, the in-plane slow axis of the optically anisotropic layer 12 rotates by −85° (clockwise 85°). Therefore, the angle φ4a formed by the absorption axis of the polarizer 10 and the in-plane slow axis on the surface 142 of the first optically anisotropic layer 14 is 188°.

As described above, in the aspect of FIG. 5, the in-plane slow axis of the second optically anisotropic layer 16 is at a position of −103° with reference to the absorption axis of the polarizer 10, and the twisted direction of the liquid crystal compound in the first optically anisotropic layer 14 is clockwise (right-handed twist). It should be noted that the twisted direction is determined to be right-handed twist or left-handed twist with reference to the in-plane slow axis on the surface (surface 141) of the first optically anisotropic layer 14 on the polarizer 10 side, upon observation from the white arrow in FIG. 5.

In FIG. 5, an aspect in which the in-plane slow axis of the second optically anisotropic layer 16 and the twisted direction of the liquid crystal compound in the first optically anisotropic layer 14 are clockwise has been described in detail, but a counterclockwise aspect may be configured as long as a predetermined angular relationship is satisfied. More specifically, it may be an aspect in which the in-plane slow axis of the second optically anisotropic layer 16 is at a position of 103° with reference to the absorption axis of the polarizer 10, and the twisted direction of the liquid crystal compound in the first optically anisotropic layer 14 is counterclockwise (left-handed twist).

Summarizing these aspects, in a case where the second optically anisotropic layer 16 is observed from the polarizer 10 and the counterclockwise direction is represented by a positive angle value, it is sufficient that, with the absorption axis of the polarizer 10 as a reference (0°), the in-plane slow axis of the second optically anisotropic layer 16 is in a range of 103°±10° and the twisted direction of the first optically anisotropic layer 14 is counterclockwise, or the in-plane slow axis of the second optically anisotropic layer 16 is in a range of −103°±10° and the twisted direction of the first optically anisotropic layer 14 is clockwise.

Among the aspect shown in FIG. 3 (requirement of (Xa)) and the aspect shown in FIG. 5 (requirement of (Ya)), the aspect shown in FIG. 3 is more preferable.

(Other Layers)

The circularly polarizing plate 100B may have a layer other than the polarizer 10, the second optically anisotropic layer 16, and the first optically anisotropic layer 14.

The circularly polarizing plate 100B may have a support. The aspect of the support is as described in the first embodiment described above. The circularly polarizing plate 100B may have a support between the polarizer 10 and the second optically anisotropic layer 16.

The circularly polarizing plate 100B may have an alignment film. The aspect of the alignment film is as described in the first embodiment described above.

The circularly polarizing plate 100B may have a pressure sensitive adhesive layer. In particular, the pressure sensitive adhesive layer may be provided on a surface of the first optically anisotropic layer 14 opposite to the polarizer 10 side. A known pressure sensitive adhesive is used as the pressure sensitive adhesive that constitutes the pressure sensitive adhesive layer.

(Production Method)

A method for producing a circularly polarizing plate is not particularly limited and may be, for example, a known method. The circularly polarizing plate may be continuously produced by a roll-to-roll process.

For example, a circularly polarizing plate can be produced by preparing a first optically anisotropic layer and a second optically anisotropic layer each exhibiting predetermined optical characteristics, and bonding the optically anisotropic layers and a polarizer in a predetermined order through an adhesion layer (for example, a pressure sensitive adhesive layer or an adhesive layer).

In addition, the circularly polarizing plate may be produced by sequentially preparing a first optically anisotropic layer and a second optically anisotropic layer on a support by using a polymerizable liquid crystal composition to produce an optical film, and bonding the obtained optical film with a polarizer. For example, it may be carried out in a manner that a polymerizable liquid crystal composition is applied onto a support to form a second optically anisotropic layer, and then a polymerizable liquid crystal composition is applied onto the second optically anisotropic layer to form a first optically anisotropic layer.

An aspect of the polymerizable liquid crystal composition and a procedure of the method for producing an optically anisotropic layer using the polymerizable liquid crystal composition are as described in the first embodiment.

In a case of producing the first optically anisotropic layer and the second optically anisotropic layer, the following steps 1 to 5 may be carried out. By carrying out the following step 1 to step 5, a laminate of the first optically anisotropic layer and the second optically anisotropic layer can be produced in one coating step.

Step 1: a step of applying a polymerizable liquid crystal composition containing a chiral agent including at least a photosensitive chiral agent whose helical twisting power changes upon irradiation with light, and a liquid crystal compound having a polymerizable group and having reverse wavelength dispersibility (hereinafter, also simply referred to as "liquid crystal compound" in the description of step 1 to step 5) onto a support to form a composition layer Step 2: a step of subjecting the composition layer to a heat treatment to align the liquid crystal compound in the composition layer Step 3: a step of subjecting the composition layer to light irradiation under a condition of an oxygen concentration of 1% by volume or more, after the step 2

Step 4: a step of subjecting the composition layer to a heat treatment, after the step 3.

Step 5: a step of subjecting the composition layer to a curing treatment to fix an alignment state of the liquid crystal compound to form a first optically anisotropic layer and a second optically anisotropic layer, after the step 4

Hereinafter, the procedure of each of the steps will be described in detail.

[Step 1]

The step 1 is a step of applying a polymerizable liquid crystal composition containing a chiral agent including at least a photosensitive chiral agent whose helical twisting power changes upon irradiation with light, a liquid crystal compound having a polymerizable group and having reverse wavelength dispersibility, and an alignment control agent onto a support to form a composition layer. Carrying out this step leads to the formation of a composition layer to be subjected to a light irradiation treatment which will be described later.

The various components contained in the polymerizable liquid crystal composition are as described above, and the photosensitive chiral agent not described above will be described in detail below.

The helical twisting power (HTP) of the chiral agent is a factor indicating a helical alignment ability expressed by Expression (X).

HTP=1/(length(unit: μm) of helical pitch×concentration(% by mass) of chiral agent with respect to liquid crystal compound)[μm$^{-1}$]  Expression (X)

The length of the helical pitch refers to a length of pitch P (=the period of the helix) of a helical structure of the cholesteric liquid crystalline phase and can be measured by the method described in Handbook of Liquid Crystals (published by Maruzen Co., Ltd.), p. 196.

The photosensitive chiral agent whose helical twisting power changes upon irradiation with light (hereinafter, also simply referred to as "chiral agent A") may be liquid crystalline or non-liquid crystalline. The chiral agent A generally contains an asymmetric carbon atom in many cases. The chiral agent A may be an axial asymmetric compound or planar asymmetric compound that does not contain an asymmetric carbon atom.

The chiral agent A may have a polymerizable group.

The chiral agent A may be a chiral agent whose helical twisting power increases upon irradiation with light, or may be a chiral agent whose helical twisting power decreases upon irradiation with light. Above all, a chiral agent whose helical twisting power decreases upon irradiation with light is preferable.

The "increase and decrease in helical twisting power" in the present specification represents an increase or a decrease in helical twisting power in a case where an initial helical direction (helical direction before irradiation with light) of the chiral agent A is defined as "positive". Therefore, even in a case where the helical twisting power of a chiral agent continues to decrease and goes below zero upon irradiation with light and therefore the helical direction is "negative" (that is, even in a case where a chiral agent induces a helix in a helical direction opposite to an initial helical direction (helical direction before irradiation with light)), such a chiral agent also corresponds to the "chiral agent whose helical twisting power decreases".

The chiral agent A may be, for example, a so-called photoreactive chiral agent. The photoreactive chiral agent is a compound which has a chiral site and a photoreactive site that undergoes a structural change upon irradiation with light and which greatly changes a twisting power of a liquid crystal compound according to an irradiation amount, for example.

Above all, the chiral agent A is preferably a compound having at least a photoisomerization site, and the photoisomerization site more preferably has a photoisomerizable double bond. The photoisomerization site having a photoisomerizable double bond is preferably a cinnamoyl site, a chalcone site, an azobenzene site, or a stilbene site from the viewpoint that photoisomerization is likely to occur and the difference in helical twisting power before and after light irradiation is large; and more preferably a cinnamoyl site, a chalcone site, or a stilbene site from the viewpoint that the absorption of visible light is small. The photoisomerization site corresponds to the above-mentioned photoreactive site that undergoes a structural change upon irradiation with light.

In the step 1, at least the above-mentioned chiral agent A is used. The step 1 may be an aspect in which two or more chiral agents A are used, or may be an aspect in which at least one chiral agent A and at least one chiral agent whose helical twisting power does not change upon irradiation with light (hereinafter, simply referred to as "chiral agent B") are used.

The chiral agent B may be liquid crystalline or non-liquid crystalline. The chiral agent B generally contains an asymmetric carbon atom in many cases. The chiral agent B may be an axial asymmetric compound or planar asymmetric compound that does not contain an asymmetric carbon atom.

The chiral agent B may have a polymerizable group.

A known chiral agent can be used as the chiral agent B.

The chiral agent B is preferably a chiral agent that induces a helix in a direction opposite to the direction of the helix induced by the chiral agent A. That is, for example, in a case where the helix induced by the chiral agent A is right-handed, the helix induced by the chiral agent B is left-handed.

The content of the chiral agent A in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit thereof is not particularly limited, and is preferably 0.01% by mass or more, more preferably 0.02% by mass or more, and still more preferably 0.05% by mass or more.

The chiral agent A may be used alone or in combination of two or more thereof. In a case where two or more of the chiral agents A are used in combination, the total content thereof is preferably within the above range.

The content of the chiral agent B in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit thereof is not particularly limited, and is preferably 0.01% by mass or more, more preferably 0.02% by mass or more, and still more preferably 0.05% by mass or more.

The chiral agent B may be used alone or in combination of two or more thereof. In a case where two or more of the chiral agents B are used in combination, the total content thereof is preferably within the above range.

The total content of the chiral agent (total content of all chiral agents) in the composition layer is preferably 5.0% by mass or less, more preferably 4.0% by mass or less, still more preferably 2.0% by mass or less, and particularly preferably 1.0% by mass or less with respect to the total mass of the liquid crystal compound. The lower limit thereof is not particularly limited, and is preferably 0.01% by mass or more, more preferably 0.02% by mass or more, and still more preferably 0.05% by mass or more.

The method of applying the polymerizable liquid crystal composition to form the composition layer is not particularly limited, and may be, for example, a method of applying the above-mentioned polymerizable liquid crystal composition.

The film thickness of the composition layer is not particularly limited and is preferably 0.1 to 20 µm, more preferably 0.2 to 15 µm, and still more preferably 0.5 to 10 µm.

[Step 2]

The step 2 is a step of subjecting the composition layer to a heat treatment to align the liquid crystal compound in the composition layer. Carrying out this step brings the liquid crystal compound in the composition layer into a predetermined alignment state.

With regard to heat treatment conditions, the optimum conditions are selected according to the liquid crystal compound used.

Above all, the heating temperature is often 10° C. to 250° C., more often 40° C. to 150° C., and still more often 50° C. to 130° C.

The heating time is often 0.1 to 60 minutes and more often 0.2 to 5 minutes.

The absolute value of the weighted average helical twisting power of the chiral agent in the composition layer formed by the step 1 is preferably 0.0 to 1.9 $\mu m^{-1}$, more preferably 0.0 to 1.5 $\mu m^{-1}$, still more preferably 0.0 to 1.0 $\mu m^{-1}$, particularly preferably 0.0 to 0.5 $\mu m^{-1}$, and most preferably zero.

The weighted average helical twisting power of the chiral agent is a total value obtained by dividing the product of a helical twisting power of each chiral agent contained in the composition layer and a concentration (% by mass) of each chiral agent in the composition layer by a total concentration (% by mass) of the chiral agents in the composition layer, in a case where two or more chiral agents are contained in the composition layer. The weighted average helical twisting power is represented by Expression (Y), for example, in a case where two chiral agents (chiral agent X and chiral agent Y) are used in combination.

Weighted average helical twisting power($\mu m^{-1}$)=
(helical twisting power($\mu m^{-1}$) of chiral agent
X×concentration(% by mass) of chiral agent X
in composition layer+helical twisting power
($\mu m^{-1}$) of chiral agent Y×concentration(% by
mass) of chiral agent Y in composition layer)/
(concentration(% by mass) of chiral agent X in
composition layer+concentration(% by mass) of
chiral agent Y in composition layer)     Expression (Y)

However, in Expression (Y), in a case where the helical direction of the chiral agent is dextrorotatory, the helical twisting power has a positive value. In addition, in a case where the helical direction of the chiral agent is levorotatory, the helical twisting power has a negative value. That is, for example, in a case of a chiral agent having a helical twisting power of 10 $\mu m^{-1}$, the helical twisting power is expressed as 10 $\mu m^{-1}$ in a case where the helical direction of the helix induced by the chiral agent is dextrorotatory. On the other hand, in a case where the helical direction of the helix induced by the chiral agent is levorotatory, the helical twisting power is expressed as −10 $\mu m^{-1}$.

Figure 7:
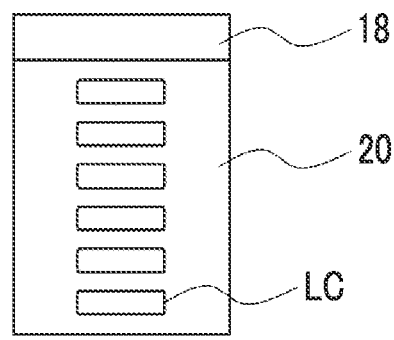
FIG. 7 is a cross-sectional view of a composition layer for explaining a step 1.

In a case where the absolute value of the weighted average helical twisting power of the chiral agent in the composition layer formed in the step 1 is 0, a composition layer 20 in which a rod-like liquid crystal compound LC having reverse wavelength dispersibility is aligned is formed on a support 18, as shown in FIG. 7.

It should be noted that FIG. 7 is a schematic cross-sectional view of the support 18 and the composition layer 20. In the composition layer 20 shown in FIG. 7, the chiral agent A and the chiral agent B are present at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are assumed to be the same.

[Step 3]

The step 3 is a step of subjecting the composition layer to light irradiation in the presence of oxygen, after the step 2. In the following, the mechanism of this step will be described with reference to the accompanying drawings.

Figure 8:
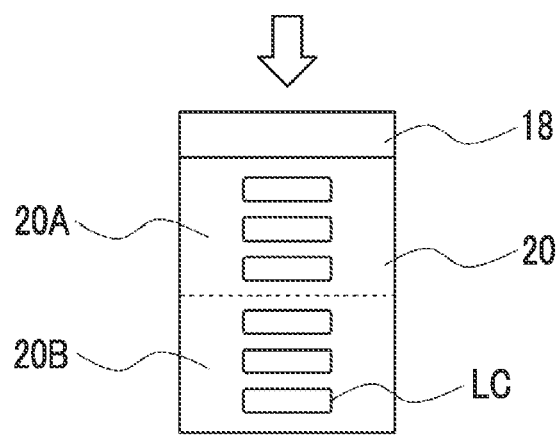
FIG. 8 is a cross-sectional view of the composition layer for explaining a step 2.

As shown in FIG. 8, in the above-mentioned step 2, light irradiation is carried out from the direction opposite to the composition layer 20 side of the support 18 (the direction of the white arrow in FIG. 8) under the condition that the oxygen concentration is 1% by volume or more. Although the light irradiation is carried out from the support 18 side in FIG. 8, the light irradiation may be carried out from the composition layer 20 side.

At that time, in a case where a first region 20A of the composition layer 20 on the support 18 side and a second region 20B of the composition layer 20 opposite to the support 18 side are compared, the surface of the second region 20B is on the air side, so that the oxygen concentration in the second region 20B is high and the oxygen concentration in the first region 20A is low. Therefore, in a case where the composition layer 20 is irradiated with light, the polymerization of the liquid crystal compound easily proceeds in the first region 20A, and the alignment state of the liquid crystal compound is fixed. The chiral agent A is also present in the first region 20A, and the chiral agent A is also exposed to light and therefore the helical twisting power changes. However, since the alignment state of the liquid crystal compound is fixed in the first region 20A, there is no change in the alignment state of the liquid crystal compound even in a case where the step 4 of subjecting the light-irradiated composition layer to a heat treatment, which will be described later, is carried out.

In addition, since the oxygen concentration is high in the second region 20B, the polymerization of the liquid crystal compound is inhibited by oxygen and therefore the polymerization does not proceed easily even in a case where light irradiation is carried out. Since the chiral agent A is also present in the second region 20B, the chiral agent A is exposed to light and therefore the helical twisting power changes. Therefore, in a case where the step 4 (heat treatment) which will be described later is carried out, the alignment state of the liquid crystal compound changes along with the changed helical twisting power.

That is, the immobilization of the alignment state of the liquid crystal compound is likely to proceed in the substrate-side region of the composition layer by carrying out the step 3. In addition, the immobilization of the alignment state of the liquid crystal compound is difficult to proceed in the region of the composition layer opposite to the substrate side, and the helical twisting power changes according to the exposed chiral agent A.

The step 3 is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit of the oxygen concentration is not particularly limited and may be, for example, 100% by volume.

The irradiation intensity of the light irradiation in the step 3 is not particularly limited and can be appropriately determined based on the helical twisting power of the chiral agent A. The irradiation amount of light irradiation in the step 3 is not particularly limited, and is preferably 300 mJ/cm$^2$ or less and more preferably 200 mJ/cm$^2$ or less from the viewpoint that a predetermined optically anisotropic layer is easily formed. The lower limit thereof is preferably 5 mJ/cm$^2$ or more and more preferably 10 mJ/cm$^2$ or more from the viewpoint that a predetermined optically anisotropic layer is easily formed.

The light irradiation in the step 3 is preferably carried out at 15° C. to 70° C. (preferably 15° C. to 50° C.).

The light used for the light irradiation may be any light that the chiral agent A is exposed to. That is, the light used for the light irradiation is not particularly limited as long as it is an actinic ray or radiation that changes the helical twisting power of the chiral agent A, and examples thereof include an emission line spectrum of a mercury lamp, a far ultraviolet ray represented by an excimer laser, an extreme ultraviolet ray, an X-ray, an ultraviolet ray, and an electron beam. Above all, an ultraviolet ray is preferable.

[Step 4]

The step 4 is a step of subjecting the composition layer to a heat treatment, after the step 3. Carrying out this step leads to a change in the alignment state of the liquid crystal compound in the region where the helical twisting power of the chiral agent A in the composition layer subjected to light irradiation changes.

In the following, the mechanism of this step will be described with reference to the accompanying drawings.

As described above, in a case where the step 3 is carried out on the composition layer 20 shown in FIG. 8, the alignment state of the liquid crystal compound is fixed in the first region 20A, whereas the polymerization of the liquid crystal compound is difficult to proceed and the alignment state of the liquid crystal compound is not fixed in the second region 20B. In addition, the helical twisting power of the chiral agent A changes in the second region 20B. In a case where such a change in the helical twisting power of the chiral agent A occurs, the force of twisting the liquid crystal compound changes in the second region 20B, as compared with the state before light irradiation. This point will be described in more detail.

As described above, in the composition layer 20 shown in FIG. 8, the chiral agent A and the chiral agent B are present at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are the same. Therefore, the weighted average helical twisting power of the chiral agent in the composition layer before light irradiation is zero.

Figure 9:
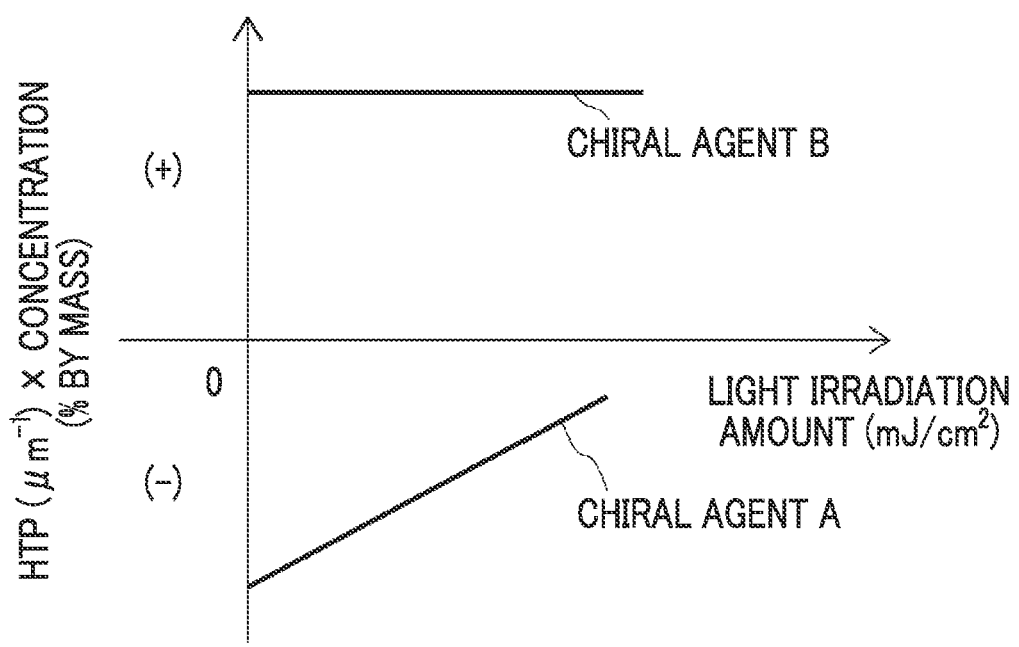
FIG. 9 is a schematic diagram of a graph plotting a relationship between a helical twisting power (HTP) ($\mu m^{-1}$)×a concentration (% by mass) and a light irradiation amount (mJ/cm$^2$) for each of a chiral agent A and a chiral agent B.

The above aspect is shown in FIG. 9. In addition, in FIG. 9, the vertical axis represents the "helical twisting power ($\mu m^{-1}$) of chiral agent×concentration (% by mass) of chiral agent", and the helical twisting power increases as the value thereof deviates from zero. The lateral axis represents the "light irradiation amount ($mJ/cm^2$)".

First, the relationship between the chiral agent A and the chiral agent B in the composition layer before light irradiation corresponds to the time in a case where the light irradiation amount is zero, and therefore corresponds to a state in which the absolute value of "helical twisting power ($\mu m^{-1}$) of chiral agent A×concentration (% by mass) of chiral agent A" and the absolute value of "helical twisting power ($\mu m^{-1}$) of chiral agent B×concentration (% by mass) of chiral agent B" are equal. That is, the helical twisting powers of both the chiral agent A that induces levorotatory turning and the chiral agent B that induces dextrorotatory turning are offset.

Figure 10:
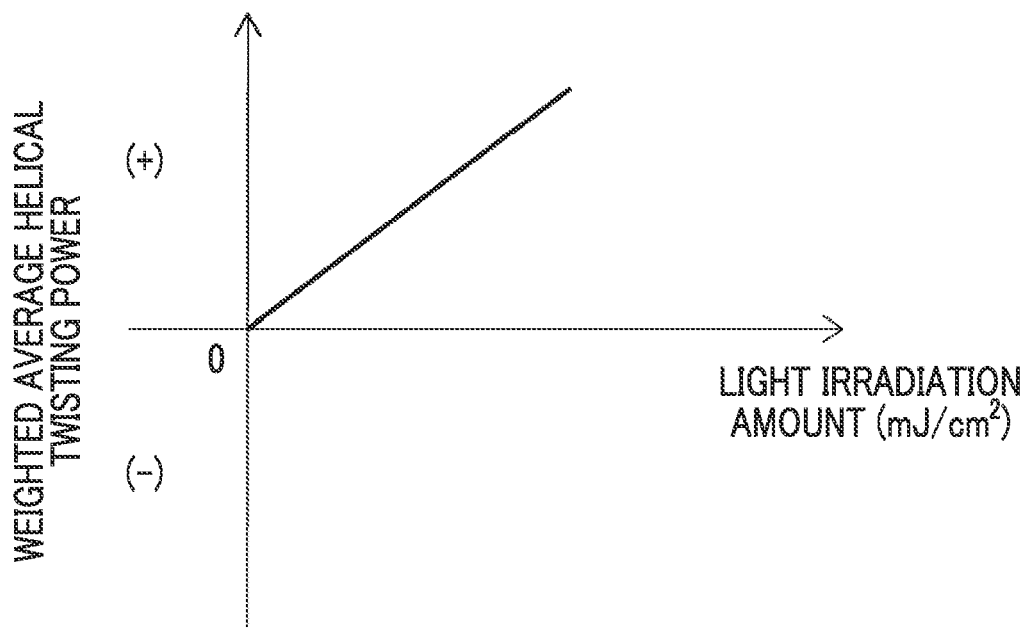
FIG. 10 is a schematic diagram of a graph plotting a relationship between a weighted average helical twisting power ($\mu m^{-1}$) and a light irradiation amount (mJ/cm$^2$) in a system in which the chiral agent A and the chiral agent B are used in combination.

In a case where light irradiation is carried out in the second region 20B in such a state and the helical twisting power of the chiral agent A decreases with the light irradiation amount as shown in FIG. 9, the weighted average helical twisting power of the chiral agent in the second region 20B is large and therefore the dextrorotatory helical twisting power is strong, as shown in FIG. 10. That is, as for the helical twisting power that induces the helix of the liquid crystal compound, an increase in the irradiation amount leads to an increase in the helical twisting power in the direction (+) of the helix induced by the chiral agent B.

Figure 11:
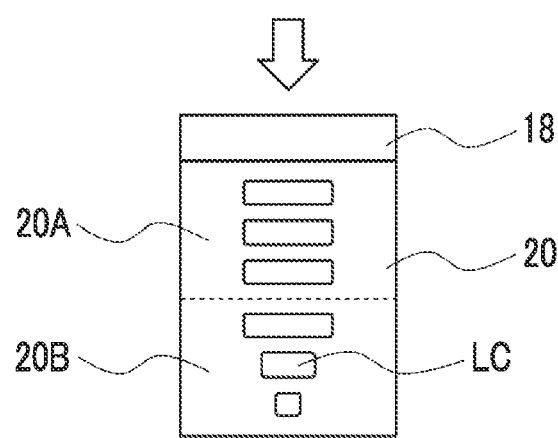
FIG. 11 is a cross-sectional view of the composition layer for explaining a case where a step 5 is carried out.

Therefore, in a case where the composition layer 20 after the step 3 in which such a change in the weighted average helical twisting power occurred is subjected to a heat treatment to promote the realignment of the liquid crystal compound, the liquid crystal compound LC is twist-aligned along a helical axis extending along the thickness direction of the composition layer 20 in the second region 20B, as shown in FIG. 11.

On the other hand, as described above, the polymerization of the liquid crystal compound proceeds to fix the alignment state of the liquid crystal compound during the step 3 in the first region 20A of the composition layer 20, so that the realignment of the liquid crystal compound does not proceed.

As described above, carrying out the step 4 leads to the formation of a plurality of regions having different alignment states of the liquid crystal compound along the thickness direction of the composition layer.

The degree of twist of the liquid crystal compound LC can be appropriately adjusted depending on the type of chiral agent A used, the exposure amount in the step 3, and the like, and therefore a predetermined twisted angle can be achieved.

In the above description, the aspect in which a chiral agent whose helical twisting power decreases upon irradiation with light is used as the chiral agent A has been described, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound is twist-aligned in the turning direction induced by the chiral agent A.

In addition, in the above description, the aspect in which the chiral agent A and the chiral agent B are used in combination has been described, but the present invention is not limited to this aspect. For example, it may be an aspect in which two types of chiral agents A are used. Specifically, it may be an aspect in which a chiral agent A1 that induces levorotatory turning and a chiral agent A2 that induces dextrorotatory turning are used in combination. The chiral agents A1 and A2 may be each independently a chiral agent whose helical twisting power increases or a chiral agent whose helical twisting power decreases. For example, a chiral agent that induces levorotatory turning and whose helical twisting power increases upon irradiation with light and a chiral agent that induces dextrorotatory turning and whose helical twisting power decreases upon irradiation with light may be used in combination.

With regard to heat treatment conditions, the optimum conditions are selected according to the liquid crystal compound used.

Above all, the heating temperature is preferably a temperature for heating from the state of the step 3, often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

In addition, the absolute value of the weighted average helical twisting power of the chiral agent in the composition layer after light irradiation is not particularly limited, and the absolute value of the difference between the weighted average helical twisting power of the chiral agent in the composition layer after light irradiation and the weighted average helical twisting power of the chiral agent in the composition layer before light irradiation is preferably 0.05 $\mu m^{-1}$ or more, more preferably 0.05 to 10.0 and still more preferably 0.1 to 10.0 $\mu m^{-1}$.

[Step 5]

The step 5 is a step of subjecting the composition layer to a curing treatment to fix an alignment state of the liquid crystal compound to form a first optically anisotropic layer and a second optically anisotropic layer, after the step 4. By carrying out this step, the alignment state of the liquid crystal compound in the composition layer is fixed, and as a result, a predetermined optically anisotropic layer is formed. That is, a laminated film of an optically anisotropic layer formed by fixing a liquid crystal compound twist-aligned and an optically anisotropic layer formed by fixing a liquid crystal compound not twist-aligned can be formed in a single application treatment.

The method of the curing treatment is not particularly limited, and examples thereof include a photocuring treatment and a thermal curing treatment. Above all, a light irradiation treatment is preferable, and an ultraviolet irradiation treatment is more preferable.

For ultraviolet irradiation, a light source such as an ultraviolet lamp is used.

The irradiation amount of light (for example, ultraviolet rays) is not particularly limited, and is generally preferably about 100 to 800 mJ/cm$^2$.

Third Embodiment

Figure 12:
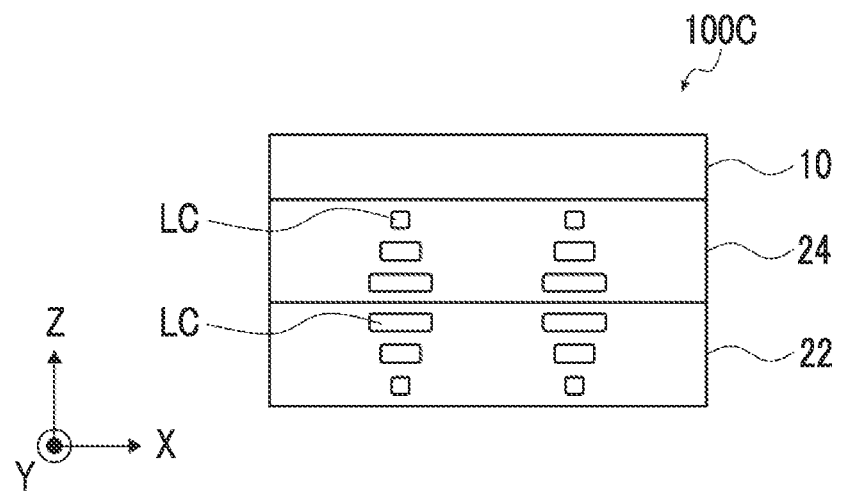
FIG. 12 is an example of a schematic cross-sectional view of a third embodiment of the circularly polarizing plate of the present invention.

A third embodiment of the circularly polarizing plate according to the embodiment of the present invention will be described with reference to the accompanying drawings. FIG. 12 shows a schematic cross-sectional view of a third embodiment of the circularly polarizing plate according to the embodiment of the present invention.

A circularly polarizing plate 100C has a polarizer 10, a fourth optically anisotropic layer 24, and a third optically anisotropic layer 22 in this order. Both the third optically anisotropic layer 22 and the fourth optically anisotropic layer 24 are layers formed by fixing a rod-like liquid crystal compound LC twist-aligned with a thickness direction as a helical axis. In addition, the molecular axis of the rod-like liquid crystal compound LC in the third optically anisotropic layer 22 is horizontal to the surface of the third optically anisotropic layer 22, and the molecular axis of the rod-like liquid crystal compound LC in the fourth optically anisotropic layer 24 is horizontal to the surface of the fourth optically anisotropic layer 24. In the circularly polarizing plate 100C, the third optically anisotropic layer 22 and the fourth optically anisotropic layer 24 are included as optically anisotropic layers formed of a liquid crystal compound. That is, in the circularly polarizing plate 100C, the optically anisotropic layer has a multi-layer structure.

Hereinafter, each layer will be described in detail. The polarizer 10 is the same as the polarizer 10 described in the first embodiment described above, and therefore the description thereof will be omitted.

Hereinafter, each layer will be described in detail.

(Third Optically Anisotropic Layer 22)

As shown in FIG. 12, the third optically anisotropic layer 22 is a layer formed by fixing the rod-like liquid crystal compound LC twist-aligned with a thickness direction (a z-axis direction in FIG. 12) as a helical axis, and the molecular axis of the rod-like liquid crystal compound LC in the third optically anisotropic layer is horizontal to the surface of the third optically anisotropic layer. The third optically anisotropic layer 22 is preferably a layer formed by fixing a so-called chiral nematic phase having a helical structure. That is, the third optically anisotropic layer 22 is preferably a layer formed by fixing a liquid crystal compound that is twist-aligned with a thickness direction as a helical axis and whose molecular axis is horizontally aligned. In a case of forming the above phase, it is preferable to use a mixture of a liquid crystal compound exhibiting a nematic liquid crystal phase and a chiral agent which will be described later.

The meaning of the "fixed" state is as described above.

In addition, the definition that the molecular axis is horizontal to the surface of the optically anisotropic layer is as described in the first embodiment described above.

The twisted angle of the rod-like liquid crystal compound LC (the twisted angle of the alignment direction of the rod-like liquid crystal compound LC) is preferably 78.6°±10.0°. That is, the twisted angle is preferably 68.6° to 88.6°. Above all, the twisted angle of the rod-like liquid crystal compound LC is more preferably 70.6° to 86.6° and still more preferably 72.6° to 84.6° from the viewpoint that the effect of the present invention is more excellent.

The phrase "the liquid crystal compound is twist-aligned" is intended to mean that the liquid crystal compound from one main surface to the other main surface of the third optically anisotropic layer 22 is twisted around the thickness direction of the third optically anisotropic layer 22 as an axis. Along with this, the alignment direction (in-plane slow axis direction) of the liquid crystal compound varies depending on the position in the thickness direction of the third optically anisotropic layer 22.

In addition, there are two types of twisted directions, but it does not matter whether the twisted direction is right-handed or left-handed. In FIG. 12, the right-handed twist means that the in-plane slow axis on the side of the third optically anisotropic layer 22 opposite to the polarizer 10 side is positioned clockwise with respect to the in-plane slow axis on the surface of the third optically anisotropic layer 22 on the polarizer 10 side serving as a reference axis upon observation from the polarizer 10 toward the third optically anisotropic layer 22.

The twisted angle is measured using an AxoScan (polarimeter) device of Axometrics, Inc. and using device analysis software of Axometrics, Inc.

The value of the product Δn3d3 of the refractive index anisotropy Δn3 of the third optically anisotropic layer 22 measured at a wavelength of 550 nm and the thickness d3 of the third optically anisotropic layer 22 preferably satisfies a relationship of Expression (3) from the viewpoint that the effect of the present invention is more excellent.

110 nm≤Δ$n3d3$≤170 nm    Expression (3)

Above all, the Δn3d3 more preferably satisfies a relationship of Expression (3A), and still more preferably satisfies a relationship of Expression (3B).

120 nm≤Δ$n3d3$≤160 nm    Expression (3A)

130 nm≤Δ$n3d3$≤150 nm    Expression (3B)

The Δn3d3 is measured in the same manner as in the method for measuring the twisted angle using an AxoScan (polarimeter) device of Axometrics, Inc. and using device analysis software of Axometrics, Inc.

(Fourth Optically Anisotropic Layer 24)

As shown in FIG. 12, the fourth optically anisotropic layer 24 is a layer formed by fixing the rod-like liquid crystal compound LC twist-aligned with a thickness direction (a z-axis direction in FIG. 12) as a helical axis, and the molecular axis of the rod-like liquid crystal compound LC in the fourth optically anisotropic layer is horizontal to the surface of the fourth optically anisotropic layer. The fourth optically anisotropic layer 24 is preferably a layer formed by fixing a so-called chiral nematic phase having a helical structure. That is, the fourth optically anisotropic layer 24 is preferably a layer formed by fixing a liquid crystal compound that is twist-aligned with a thickness direction as a helical axis and whose molecular axis is horizontally aligned. In a case of forming the above phase, it is preferable to use a mixture of a liquid crystal compound exhibiting a nematic liquid crystal phase and a chiral agent which will be described later.

The meaning of the "fixed" state is as described above.

In addition, the definition that the molecular axis is horizontal to the surface of the optically anisotropic layer is as described in the first embodiment described above.

The twisted angle of the rod-like liquid crystal compound LC (the twisted angle of the alignment direction of the rod-like liquid crystal compound LC) is preferably in a range of 26.5°±10.0°. That is, the twisted angle is preferably 16.5° to 36.5°. Above all, the twisted angle of the rod-like liquid crystal compound LC is more preferably 18.5° to 34.5° and still more preferably 20.5° to 32.5° from the viewpoint that the effect of the present invention is more excellent.

The phrase "the liquid crystal compound is twist-aligned" is intended to mean that the liquid crystal compound from one main surface to the other main surface of the fourth optically anisotropic layer 24 is twisted around the thickness direction of the fourth optically anisotropic layer 24 as an axis. Along with this, the alignment direction (in-plane slow axis direction) of the liquid crystal compound varies depending on the position in the thickness direction of the fourth optically anisotropic layer 24.

In addition, there are two types of twisted directions, but it does not matter whether the twisted direction is right-handed or left-handed. In FIG. 12, the right-handed twist means that the in-plane slow axis on the side of the fourth optically anisotropic layer 24 opposite to the polarizer 10 side is positioned clockwise with respect to the in-plane slow axis on the surface of the fourth optically anisotropic layer 24 on the polarizer 10 side serving as a reference axis upon observation from the polarizer 10 toward the fourth optically anisotropic layer 24.

The value of the product $\Delta n4d4$ of the refractive index anisotropy $\Delta n4$ of the fourth optically anisotropic layer 24 measured at a wavelength of 550 nm and the thickness d4 of the fourth optically anisotropic layer 24 preferably satisfies a relationship of Expression (4) from the viewpoint that the effect of the present invention is more excellent.

$$252 \text{ nm} \leq \Delta n4d4 \leq 312 \text{ nm} \quad \text{Expression (4)}$$

Above all, the $\Delta n4d4$ more preferably satisfies a relationship of Expression (4A), and still more preferably satisfies a relationship of Expression (4B).

$$262 \text{ nm} \leq \Delta n4d4 \leq 302 \text{ nm} \quad \text{Expression (4A)}$$

$$272 \text{ nm} \leq \Delta n4d4 \leq 292 \text{ nm} \quad \text{Expression (4B)}$$

The $\Delta n4d4$ is measured using an AxoScan (polarimeter) device of Axometrics, Inc. and using device analysis software of Axometrics, Inc.

The in-plane slow axis on the surface of the third optically anisotropic layer 22 on the fourth optically anisotropic layer 24 side is parallel to the in-plane slow axis on the surface of the fourth optically anisotropic layer 24 on the third optically anisotropic layer 22 side. The definition of the "parallel" is as described above. That is, the angle formed by the in-plane slow axis on the surface of the third optically anisotropic layer 22 on the fourth optically anisotropic layer 24 side with respect to the in-plane slow axis on the surface of the fourth optically anisotropic layer 24 on the third optically anisotropic layer 22 side is within 10° (0° to 10°).

It is preferable that the twisted direction of the liquid crystal compound in the third optically anisotropic layer 22 and the twisted direction of the liquid crystal compound in the fourth optically anisotropic layer 24 are the same directions.

For example, in a case where the in-plane slow axis of the third optically anisotropic layer 22 is rotated clockwise with reference to the in-plane slow axis on the surface of the third optically anisotropic layer 22 opposite to the fourth optically anisotropic layer 24 upon observation of the circularly polarizing plate 100C from the polarizer 10 side, it is preferable that the in-plane slow axis on the surface of the fourth optically anisotropic layer 24 opposite to the third optically anisotropic layer 22 side is rotated clockwise with reference to the in-plane slow axis on the surface of the fourth optically anisotropic layer 24 on the third optically anisotropic layer 22 side.

In addition, in a case where the in-plane slow axis of the third optically anisotropic layer 22 is rotated counterclockwise with reference to the in-plane slow axis on the surface of the third optically anisotropic layer 22 opposite to the fourth optically anisotropic layer 24 upon observation of the circularly polarizing plate 100C from the polarizer 10 side, it is preferable that the in-plane slow axis on the surface of the fourth optically anisotropic layer 24 opposite to the third optically anisotropic layer 22 side is rotated counterclockwise with reference to the in-plane slow axis on the surface of the fourth optically anisotropic layer 24 on the third optically anisotropic layer 22 side.

An alignment film which will be described later may be disposed between the third optically anisotropic layer 22 and the fourth optically anisotropic layer 24 but, as shown in FIG. 12, it is preferable that the third optically anisotropic layer 22 and the fourth optically anisotropic layer 24 are adjacent to each other and substantially no alignment film is provided between the third optically anisotropic layer 22 and the fourth optically anisotropic layer 24. In a case where substantially no alignment film is provided between the third optically anisotropic layer 22 and the fourth optically anisotropic layer 24, covalent bonds between the compounds contained in the respective optically anisotropic layers can be utilized, resulting in more excellent adhesiveness.

In FIG. 12, a rod-like liquid crystal compound is used for forming the third optically anisotropic layer 22 and the fourth optically anisotropic layer 24, but the present invention is not limited to this aspect.

Examples of the liquid crystal compound include the liquid crystal compounds described in the first embodiment.

The third optically anisotropic layer 22 and the fourth optically anisotropic layer 24 are more preferably formed of a liquid crystal compound having a polymerizable group and having reverse wavelength dispersibility since a change in temperature or a change in humidity can be reduced.

That is, the third optically anisotropic layer 22 or the fourth optically anisotropic layer 24 is preferably a layer formed by fixing a liquid crystal compound having a polymerizable group and having a reverse wavelength dispersibility by polymerization or the like.

The type of the polymerizable group is not particularly limited, and is preferably a functional group capable of an addition polymerization reaction, more preferably a polymerizable ethylenic unsaturated group or a ring-polymerizable group, still more preferably a (meth)acryloyl group, a vinyl group, a styryl group, or an allyl group, and particularly preferably a (meth)acryloyl group.

In the circularly polarizing plate 100C, the relationship between the absorption axis of the polarizer 10 and the in-plane slow axis of the third optically anisotropic layer 22 and the fourth optically anisotropic layer 24 preferably satisfies the following requirement (Xb) or (Yb).

(Xb) The angle formed by the in-plane slow axis on the surface of the fourth optically anisotropic layer 24 on the polarizer 10 side and the absorption axis of the polarizer 10 is in a range of 0°±10° (−10° to 10°) (preferably in a range of 0°±6°).

(Yb) The angle formed by the in-plane slow axis on the surface of the fourth optically anisotropic layer 24 on the polarizer 10 side and the absorption axis of the polarizer 10 is in a range of 90°±10° (80° to 100°) (preferably in a range of 90°±6°).

As described above, the in-plane slow axis on the surface of the third optically anisotropic layer 22 on the fourth optically anisotropic layer 24 side is parallel to the in-plane slow axis on the surface of the fourth optically anisotropic layer 24 on the third optically anisotropic layer 22 side.

The relationship among the absorption axis of the polarizer 10, the in-plane slow axis of the fourth optically anisotropic layer 24, and the in-plane slow axis of the third optically anisotropic layer 22 in the requirement represented by (Xb) will be described in more detail with reference to FIG. 13.

Figure 13:
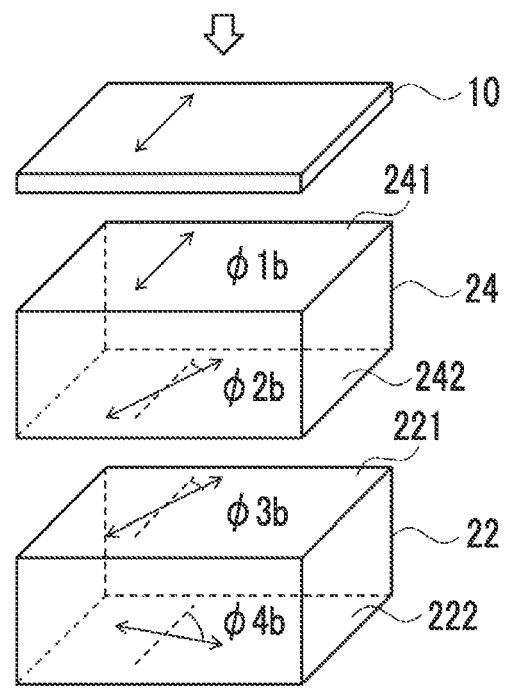
FIG. 13 is a view showing a relationship between the absorption axis of the polarizer 10 and an in-plane slow axis of each of a third optically anisotropic layer 22 and a fourth optically anisotropic layer 24 in one aspect of the third embodiment of the circularly polarizing plate of the present invention.

In FIG. 13, an arrow in the polarizer 10 represents an absorption axis, and an arrow in the fourth optically anisotropic layer 24 and the third optically anisotropic layer 22 represents an in-plane slow axis in each layer. In addition, FIG. 14 shows a relationship of the angle among the absorption axis of the polarizer 10, the in-plane slow axis of the fourth optically anisotropic layer 24, and the in-plane slow axis of the third optically anisotropic layer 22 upon observation from a white arrow in FIG. 13.

Figure 14:
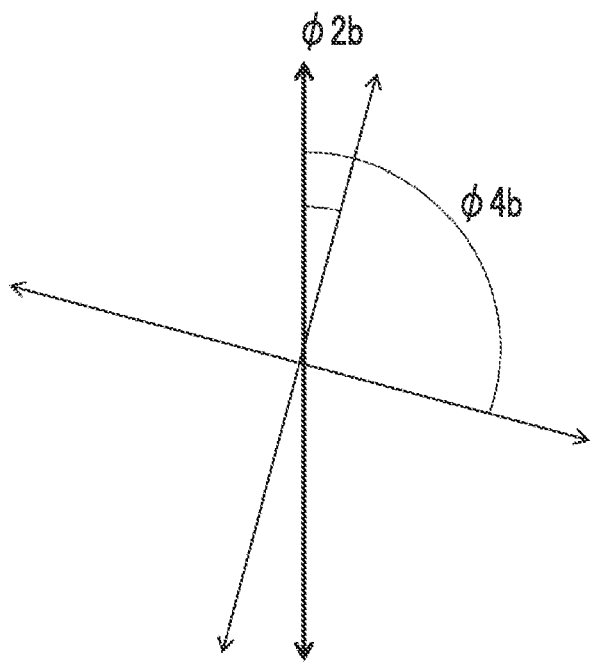
FIG. 14 is a schematic view showing a relationship of an angle between the absorption axis of the polarizer 10 and the in-plane slow axis of each of the third optically anisotropic layer 22 and the fourth optically anisotropic layer 24, upon observation from the direction of an arrow in FIG. 13.

The rotation angle of the in-plane slow axis in FIG. 14 is represented by a positive value in a counterclockwise direction and a negative value in a clockwise direction, with reference to the absorption axis of the polarizer 10, upon observation from the white arrow in FIG. 13.

In FIG. 13, the absorption axis of the polarizer 10 and the in-plane slow axis on a surface 241 of the fourth optically anisotropic layer 24 on the polarizer 10 side are parallel to each other. The definition of the "parallel" is as described above. That is, the angle formed by the absorption axis of the polarizer 10 and the in-plane slow axis on the surface 241 of the fourth optically anisotropic layer 24 on the polarizer 10 side is 0°±10°.

As described above, the fourth optically anisotropic layer 24 is a layer formed by fixing a twist-aligned liquid crystal compound with a thickness direction as a helical axis. Therefore, as shown in FIG. 13, the in-plane slow axis on the surface 241 of the fourth optically anisotropic layer 24 on the polarizer 10 side and the in-plane slow axis on a surface 242 of the fourth optically anisotropic layer 24 on the third optically anisotropic layer 22 side form the above-mentioned twisted angle (26.5° in FIG. 13). That is, the in-plane slow axis of the fourth optically anisotropic layer 24 rotates by −26.5° (26.5° clockwise). Therefore, an angle φ2b formed by the absorption axis of the polarizer 10 and the in-plane slow axis on the surface 242 of the fourth optically anisotropic layer 24 is 26.5°.

Although FIG. 13 shows an aspect in which the in-plane slow axis on the surface 242 of the fourth optically anisotropic layer 24 is rotated 26.5° clockwise with respect to the in-plane slow axis on the surface 241 of the fourth optically anisotropic layer 24, the present invention is not limited to this aspect. The rotation angle may be in a range of 26.5°±10.0° in a clockwise direction.

In FIG. 13, the in-plane slow axis on the surface 242 of the fourth optically anisotropic layer 24 on the third optically anisotropic layer 22 side is parallel to the in-plane slow axis on the surface 221 of the third optically anisotropic layer 22 on the fourth optically anisotropic layer 24 side. That is, an angle φ3b formed by the absorption axis of the polarizer 10 and the in-plane slow axis on the surface 221 of the third optically anisotropic layer 22 on the fourth optically anisotropic layer 24 side is substantially the same as the angle φ2b.

As described above, the third optically anisotropic layer 22 is a layer formed by fixing a twist-aligned liquid crystal compound with a thickness direction as a helical axis. Therefore, as shown in FIG. 13, the in-plane slow axis on the surface 221 of the third optically anisotropic layer 22 on the fourth optically anisotropic layer 24 side and the in-plane slow axis on the surface 222 of the third optically anisotropic layer 22 opposite to the fourth optically anisotropic layer 24 side form the above-mentioned twisted angle (78.6° in FIG. 4). That is, the in-plane slow axis of the third optically anisotropic layer 22 rotates by −78.6° (78.6° clockwise). Therefore, an angle φ4b formed by the absorption axis of the polarizer 10 and the in-plane slow axis on the surface 222 of the third optically anisotropic layer 22 is 105.1°.

Although FIG. 13 shows an aspect in which the in-plane slow axis on the surface 222 of the third optically anisotropic layer 22 is rotated 78.6° clockwise with respect to the in-plane slow axis on the surface 221 of the third optically anisotropic layer 22, the present invention is not limited to this aspect. The rotation angle may be in a range of 78.6°±10.0° in a clockwise direction.

As described above, in the aspect of FIG. 13, the twisted directions of the liquid crystal compounds in the third optically anisotropic layer 22 and the fourth optically anisotropic layer 24 are both clockwise (right-handed twist) with reference to the absorption axis of the polarizer 10.

In FIG. 13, an aspect in which the twisted direction is clockwise (right-handed twist) has been described in detail, but it may be an aspect in which the twisted directions of the liquid crystal compounds in the third optically anisotropic layer 22 and the fourth optically anisotropic layer 24 are both counterclockwise.

Next, the relationship among the absorption axis of the polarizer 10, the in-plane slow axis of the third optically anisotropic layer 22, and the in-plane slow axis of the fourth optically anisotropic layer 24 in the embodiment represented by (Yb) will be described in more detail with reference to FIG. 15.

Figure 15:
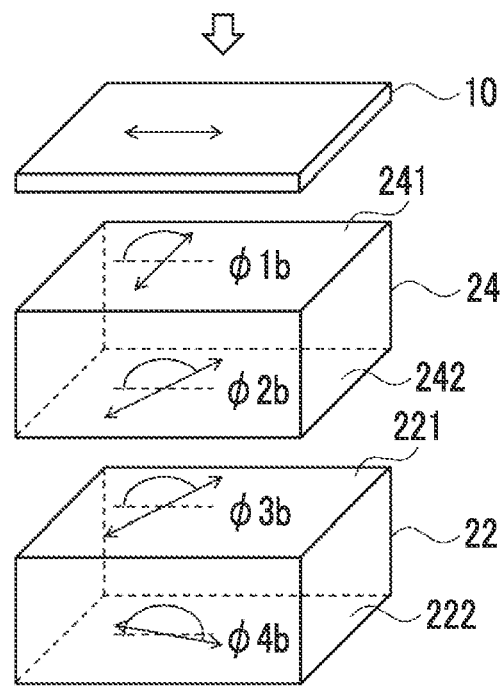
FIG. 15 is a view showing a relationship between the absorption axis of the polarizer 10 and the in-plane slow axis of each of the third optically anisotropic layer 22 and the fourth optically anisotropic layer 24 in one aspect of the third embodiment of the circularly polarizing plate of the present invention.

In FIG. 15, an arrow in the polarizer 10 represents an absorption axis, and an arrow in the third optically anisotropic layer 22 and the fourth optically anisotropic layer 24 represents an in-plane slow axis in each layer. In addition, FIG. 16 shows a relationship of the angle among the absorption axis of the polarizer 10, the in-plane slow axis on the surface 221 and the surface 222 of the third optically anisotropic layer 22, and the in-plane slow axis on the surface 241 and the surface 242 of the fourth optically anisotropic layer 24 upon observation from a white arrow in FIG. 15.

Figure 16:
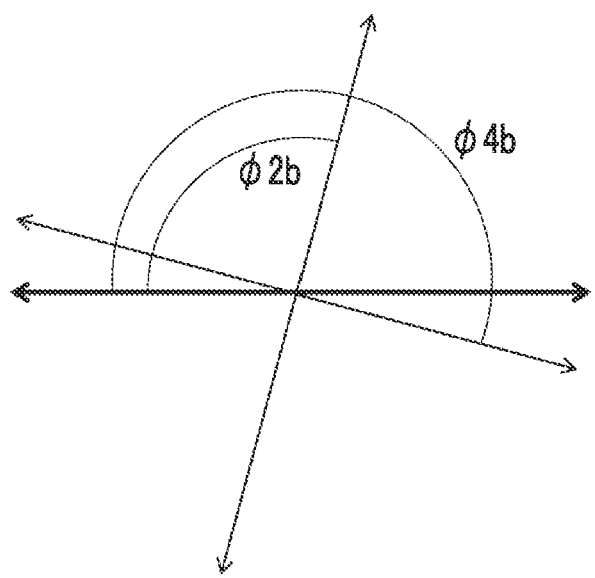
FIG. 16 is a schematic view showing a relationship of an angle between the absorption axis of the polarizer 10 and the in-plane slow axis of each of the third optically anisotropic layer 22 and the fourth optically anisotropic layer 24, upon observation from the direction of an arrow in FIG. 15.

In FIG. 16, the rotation angle of the in-plane slow axis is represented by a positive angle value in a counterclockwise direction and a negative angle value in a clockwise direction, with reference to the absorption axis of the polarizer 10 (0°), upon observation from the white arrow in FIG. 15.

The aspect shown in FIG. 15 has the same configuration as the aspect shown in FIG. 13 except that the absorption axis of the polarizer 10 differs from the absorption axis of the polarizer 10 in FIG. 15 by 90°.

In FIG. 15, the absorption axis of the polarizer 10 and the in-plane slow axis on the surface 241 of the fourth optically anisotropic layer 24 are orthogonal to each other. That is, an angle φ1b formed by the absorption axis of the polarizer 10 and the in-plane slow axis on the surface 241 of the fourth optically anisotropic layer 24 is 90°. The definition of "orthogonal" is as described above.

In addition, the in-plane slow axis on the surface 241 of the fourth optically anisotropic layer 24 on the polarizer 10 side and the in-plane slow axis on a surface 242 of the fourth optically anisotropic layer 24 on the third optically anisotropic layer 22 side form the above-mentioned twisted angle (26.5° in FIG. 15). That is, the in-plane slow axis of the fourth optically anisotropic layer 24 rotates by −26.5° (26.5° clockwise). Therefore, an angle φ2b formed by the absorption axis of the polarizer 10 and the in-plane slow axis on the surface 242 of the fourth optically anisotropic layer 24 is 116.5°.

Although FIG. 15 shows an aspect in which the in-plane slow axis on the surface 242 of the fourth optically anisotropic layer 24 is rotated 26.5° clockwise with respect to the in-plane slow axis on the surface 241 of the fourth optically anisotropic layer 24, the present invention is not limited to this aspect. The rotation angle may be in a range of 26.5°±10° in a clockwise direction.

In FIG. 15, the in-plane slow axis on the surface 242 of the fourth optically anisotropic layer 24 on the third optically anisotropic layer 22 side is parallel to the in-plane slow axis on the surface 221 of the third optically anisotropic layer 22 on the fourth optically anisotropic layer 24 side. That is, the angle φ3b formed by the absorption axis of the polarizer 10 and the in-plane slow axis on the surface 221 of the third optically anisotropic layer 22 on the fourth optically anisotropic layer 24 side is substantially the same as the angle φ2b.

The in-plane slow axis on the surface 221 of the third optically anisotropic layer 22 on the fourth optically anisotropic layer 24 side and the in-plane slow axis on the surface 222 of the third optically anisotropic layer 22 opposite to the fourth optically anisotropic layer 24 side form the above-mentioned twisted angle (78.6° in FIG. 15). That is, the in-plane slow axis of the third optically anisotropic layer 22 rotates by −78.6° (78.6° clockwise). Therefore, an angle φ4b formed by the absorption axis of the polarizer 10 and the in-plane slow axis on the surface 222 of the third optically anisotropic layer 22 is 195.1°.

Although FIG. 15 shows an aspect in which the in-plane slow axis on the surface 222 of the third optically anisotropic layer 22 is rotated 78.6° clockwise with respect to the in-plane slow axis on the surface 221 of the third optically anisotropic layer 22, the present invention is not limited to this aspect. The rotation angle may be in a range of 78.6°±10° in a clockwise direction.

As described above, in the aspect of FIG. 15, the twisted directions of the liquid crystal compounds in the third optically anisotropic layer 22 and the fourth optically anisotropic layer 24 are both clockwise (right-handed twist) with reference to the absorption axis of the polarizer 10.

In FIG. 15, an aspect in which the twisted direction is clockwise (right-handed twist) has been described in detail, but it may be an aspect in which the twisted directions of the liquid crystal compounds in the third optically anisotropic layer 22 and the fourth optically anisotropic layer 24 are both counterclockwise.

Among the aspect shown in FIG. 13 (requirement of (Xb)) and the aspect shown in FIG. 15 (requirement of (Yb)), the aspect shown in FIG. 13 is more preferable.

(Other Layers)

The circularly polarizing plate 100C may have a layer other than the polarizer 10, the third optically anisotropic layer 22, and the fourth optically anisotropic layer 24.

The circularly polarizing plate 100C may have a support. The aspect of the support is as described in the first embodiment described above. The circularly polarizing plate 100C may have a support between the polarizer 10 and the third optically anisotropic layer 22.

The circularly polarizing plate 100C may have an alignment film. The aspect of the alignment film is as described in the first embodiment described above.

The circularly polarizing plate 100C may have a pressure sensitive adhesive layer. In particular, the pressure sensitive adhesive layer may be provided on a surface of the third optically anisotropic layer 22 opposite to the polarizer 10 side. A known pressure sensitive adhesive is used as the pressure sensitive adhesive that constitutes the pressure sensitive adhesive layer.

(Production Method)

A method for producing a circularly polarizing plate is not particularly limited and may be, for example, a known method. The circularly polarizing plate may be continuously produced by a roll-to-roll process.

For example, a circularly polarizing plate can be produced by preparing a third optically anisotropic layer and a fourth optically anisotropic layer each exhibiting predetermined optical characteristics, and bonding the optically anisotropic layers and a polarizer in a predetermined order through an adhesion layer (for example, a pressure sensitive adhesive layer or an adhesive layer).

In addition, the circularly polarizing plate may be produced by sequentially preparing a third optically anisotropic layer and a fourth optically anisotropic layer on a support by using a polymerizable liquid crystal composition to produce an optical film, and bonding the obtained optical film with a polarizer. For example, it may be carried out in a manner that a polymerizable liquid crystal composition is applied onto a support to form a fourth optically anisotropic layer, and then a polymerizable liquid crystal composition is applied onto the fourth optically anisotropic layer to form a third optically anisotropic layer.

An aspect of the polymerizable liquid crystal composition and a procedure of the method for producing an optically anisotropic layer using the polymerizable liquid crystal composition are as described in the first embodiment.

<Display Device>

The display device according to the embodiment of the present invention includes a display element and the above-mentioned circularly polarizing plate. Usually, the optically anisotropic layer in the circularly polarizing plate is disposed on the display element side. That is, the polarizer in the circularly polarizing plate is disposed on the viewing side.

Examples of the display element include an organic EL display element and a liquid crystal display element.

For example, an organic EL display device includes at least an organic EL display element and a circularly polarizing plate. The circularly polarizing plate is disposed such that the optically anisotropic layer faces the organic EL display element side.

The organic EL display element is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

EXAMPLES

Hereinafter, features of the present invention will be described in more detail with reference to Examples and Comparative Examples. The materials, amounts used, proportions, treatment details, and treatment procedure shown in the following Examples can be appropriately changed without departing from the spirit and scope of the present invention. Therefore, the scope of the present invention should not be construed as being limited by the specific examples given below.

Example A1

(Preparation of Cellulose Acylate Film (Substrate))

The following components are put into a mixing tank, stirred, heated at 90° C. for 10 minutes, and then filtered through a filter paper having an average pore diameter of 34 μm and a sintered metal filter having an average pore diameter of 10 μm to produce a cellulose acylate dope (hereinafter, also simply referred to as "dope"). The concentration of solid contents of the obtained dope was 23.5% by mass, and the mass ratio of the solvent was methylene chloride/methanol/butanol=81/18/1.

| Cellulose acylate dope | |
|---|---|
| Cellulose acylate (acetyl substitution degree: 2.86, viscosity average polymerization degree: 310) | 100 parts by mass |
| Sugar ester compound 1 (represented by Chemical Formula (S4)) | 6.0 parts by mass |
| Sugar ester compound 2 (represented by Chemical Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | predetermined amount |

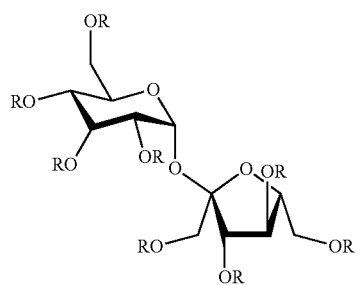

(S4)

(R = benzoyl or H
Average substitution degree 5.7)

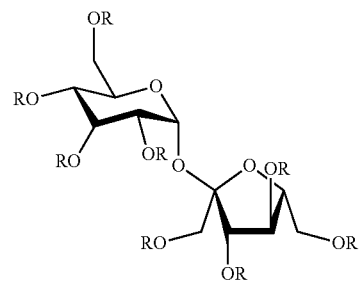

(S5)

(R = acetyl/isobutyryl = 2/6)

The above-mentioned dope was cast using a drum film forming machine. The above-mentioned dope for forming a core layer so as to be in contact with a metal substrate cooled to 0° C. and the above-mentioned dope for forming a surface layer on the core layer were co-cast from a die, and then the obtained film was peeled off. The drum was made of Steel Use Stainless (SUS).

Using a tenter device that clips both ends of a film with clips to transport the film, the film peeled off from the drum was dried at 30° C. to 40° C. for 20 minutes during transport. Next, the obtained film was post-dried by zone heating while being rolled and transported. Then, the obtained film was knurled and then wound up.

The obtained elongated cellulose acylate film had a film thickness of 40 μm, an Re(550) of 1 nm, and an Rth(550) of 26 nm.

(Formation of Optically Anisotropic Layer)

The cellulose acylate film prepared above was continuously subjected to a rubbing treatment. At this time, the longitudinal direction and the transport direction of the elongated film were parallel, and the angle between the film longitudinal direction (transport direction) and the rubbing roller rotation axis was set to 90°.

The following optically anisotropic layer coating liquid (A) was applied onto the rubbing-treated film using a geeser coating machine, and heated at 80° C. for 60 seconds. Then, the film on which the coating film was formed was irradiated with light of a metal halide lamp (manufactured by Eye Graphics Co., Ltd.) at an irradiation amount of 500 mJ/cm² and at 80° C. in a nitrogen atmosphere to immobilize the alignment state of the liquid crystal compound to prepare an optically anisotropic layer A1.

The product $\Delta nd$ of $\Delta n$ at a wavelength of 550 nm and d of the optically anisotropic layer A1 was 200 nm, the direction of the in-plane slow axis on the surface of the optically anisotropic layer A1 on the cellulose acylate film side was 90°, and the direction of the in-plane slow axis on the surface of the optically anisotropic layer A1 opposite to the cellulose acylate film side was 154° (twisted angle=64°). As for the direction of the in-plane slow axis, the counterclockwise direction is represented by a positive value with the width direction of the cellulose acylate film as a reference (0°), upon observation of the laminate of the cellulose acylate film and the optically anisotropic layer A1 from the cellulose acylate film side.

In addition, the molecular axis of the liquid crystal compound was horizontal to the surface of the cellulose acylate film (or the surface of the optically anisotropic layer).

| Composition of optically anisotropic layer coating liquid (A) | |
|---|---|
| Rod-like liquid crystal compound (A) given below | 40 parts by mass |
| Rod-like liquid crystal compound (B) given below | 40 parts by mass |
| Rod-like liquid crystal compound (C) given below | 20 parts by mass |
| Ethylene oxide-modified trimethylolpropane triacrylate (V# 360, manufactured by Osaka Organic Chemical Industry Ltd.) | 4 parts by mass |

-continued

| Composition of optically anisotropic layer coating liquid (A) | |
|---|---|
| Photopolymerization initiator (IRGACURE 819, manufactured by BASF Japan Ltd.) | 3 parts by mass |
| Chiral agent (A) given below | 0.46 parts by mass |
| Polymerizable polymer (X) given below | 0.5 parts by mass |
| Polymer (A) given below | 0.1 parts by mass |
| Methyl isobutyl ketone | 325 parts by mass |

Rod-like liquid crystal compound (A)

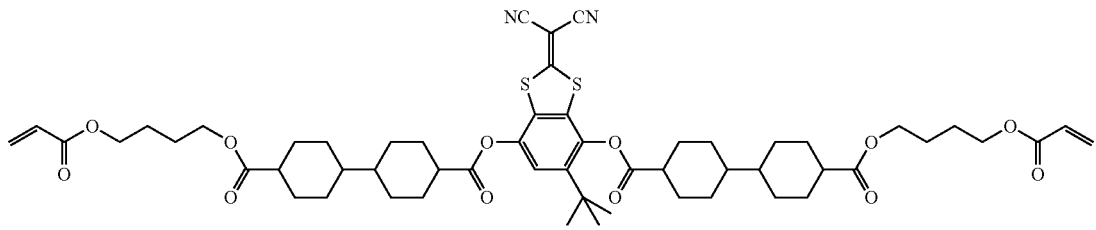

Rod-like liquid crystal compound (B)

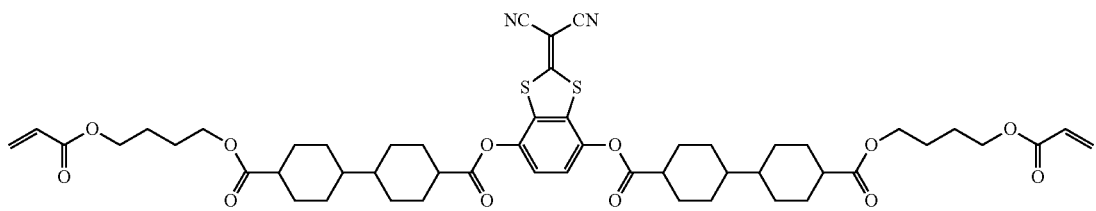

Rod-like liquid crystal compound (C) (hereinafter, corresponding to a mixture of liquid crystal compounds)

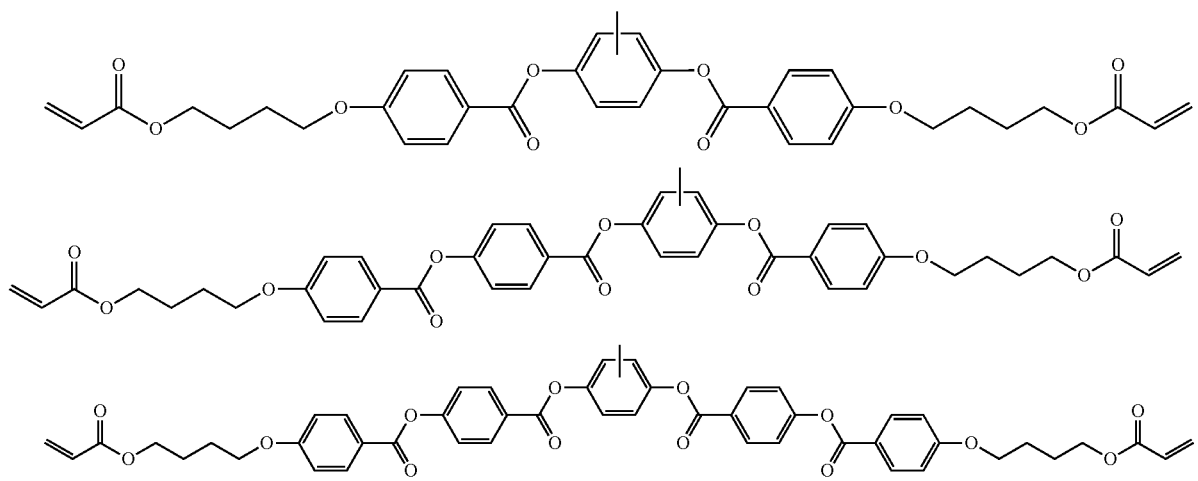

Chiral Agent (A)

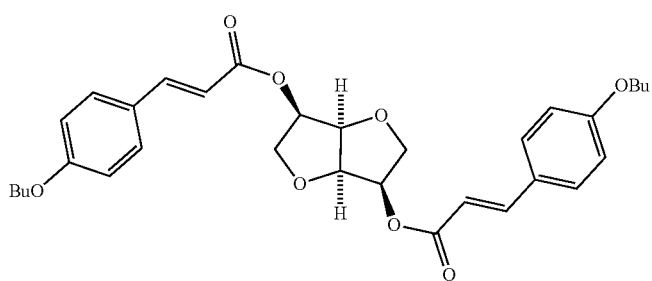

Polymerizable polymer (X)

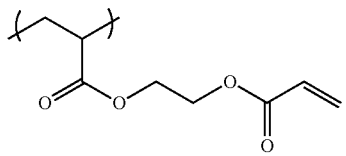

Polymer (A)

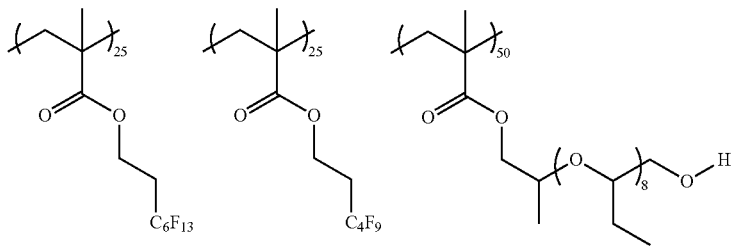

(Preparation of Circularly Polarizing Plate)

A polyvinyl alcohol (PVA) film having a thickness of 80 μm was immersed in an iodine aqueous solution having an iodine concentration of 0.05% by mass at 30° C. for 60 seconds for dyeing. Next, the film was machine-direction stretched 5 times its original length while immersed in a boric acid aqueous solution having a boric acid concentration of 4% by mass for 60 seconds, and then dried at 50° C. for 4 minutes to obtain a polarizer having a thickness of 20 μm.

A commercially available cellulose acylate-based film "TD80UL" (manufactured by FUJIFILM Corporation) was prepared and immersed in a sodium hydroxide aqueous solution at 1.5 mol/liter at 55° C., and then the sodium hydroxide was thoroughly washed away with water. Then, the film was immersed in a dilute sulfuric acid aqueous solution at 0.005 mol/liter at 35° C. for 1 minute, and then immersed in water to thoroughly wash away the dilute sulfuric acid aqueous solution. Finally, the sample was sufficiently dried at 120° C. to prepare a polarizer protective film.

The above prepared polarizer protective film was bonded to one side of the above prepared polarizer with a polyvinyl alcohol-based adhesive to prepare a laminate including a polarizer and a polarizer protective film disposed on one side of the polarizer.

A pressure sensitive adhesive (SK-2057, manufactured by Soken Chemical & Engineering Co., Ltd.) was applied to the polarizer side (side with no polarizer protective film) in the above prepared laminate to form a pressure sensitive adhesive layer, and the above prepared film having the cellulose acylate film and the optically anisotropic layer A1 was bonded thereto such that the pressure sensitive adhesive layer and the cellulose acylate film were in close contact with each other. The absorption axis of the polarizer and the in-plane slow axis on the surface of the optically anisotropic layer A1 on the polarizer side were parallel to each other.

Next, a pressure sensitive adhesive was applied onto the optically anisotropic layer A1 in the obtained laminate to form a pressure sensitive adhesive layer.

An elongated circularly polarizing plate A1 in which the polarizer, the cellulose acylate film, the optically anisotropic layer A, and the pressure sensitive adhesive layer were disposed in this order was prepared by the above procedure.

Examples A2 to A15

Circularly polarizing plates A2 to A15 were prepared in the same manner as in Example A1, except that the amount of the chiral agent used and the thickness of the optically anisotropic layer were adjusted so that the retardation and the twisted angle as shown in Table 1 were obtained, and the rubbing axis angle and the like were adjusted so that the axial relationship of each layer as shown in Table 1 was obtained.

The molecular axis of the liquid crystal compound in the optically anisotropic layer in the circularly polarizing plates A2 to A15 was horizontal to the surface of the optically anisotropic layer.

Comparative Example A1

A circularly polarizing plate AC1 was prepared in the same manner as in Example A1, except that the chiral agent was not used, the thickness of the optically anisotropic layer was adjusted so that the retardation as shown in Table 1 was obtained, and the rubbing axis angle and the like were adjusted so that the axial relationship of each layer as shown in Table 1 was obtained.

<Evaluation>

The GALAXY S4 (manufactured by Samsung Electronics Co., Ltd.) equipped with an organic EL panel (an organic EL display element) was disassembled, a touch panel with a circularly polarizing plate was peeled off from the organic EL display device, and each of the circularly polarizing plates A1 to A15 or the circularly polarizing plate AC1 prepared above was bonded to the display device so as not to allow air to enter, whereby an organic EL display device was prepared.

The organic EL display device with a circularly polarizing plate prepared above was tilted by 40° and fixed to SR-3 (manufactured by Topcon Corporation), and a reflectivity (Y) and a tint (a*/b*) under a fluorescent lamp were measured.

At that time, an average reflectivity (Y) at an azimuthal angle of 0° to 180° and a fluctuation range of a*/b* (Δa*/Δb*) were calculated. The results are summarized in Table 1.

The average reflectivity (Y) was evaluated according to the following standards. The evaluation of D or higher is preferable in terms of practical use.

A: The average reflectivity (Y) is less than 1.00%

B: The average reflectivity (Y) is 1.00% or more and less than 1.50%

C: The average reflectivity (Y) is 1.50% or more and less than 2.00%

D: The average reflectivity (Y) is 2.00% or more and less than 7.00%

E: The average reflectivity (Y) is 7.00% or more

In addition, Δa* was evaluated according to the following standards. The evaluation of A is preferable in terms of practical use.

direction of the circularly polarizing plate as a reference (0°), upon observation of the circularly polarizing plate from the polarizer side.

In Table 1, the column of "Δnd [nm]" represents a product Δnd (nm) of Δn at a wavelength of 550 nm and d (thickness) of the optically anisotropic layer.

In Table 1, the column of "Twisted angle [° ]" represents a twisted angle)(° of a twist-aligned liquid crystal compound.

In Table 1, the column of "Average Y [%]" represents an average reflectivity (Y) (%).

TABLE 1

|  |  | Comparative Example A1 | Example A1 | Example A2 | Example A3 | Example A4 | Example A5 | Example A6 | Example A7 |
|---|---|---|---|---|---|---|---|---|---|
| Polarizer | Axis [°] | 90 | 90 | 90 | 90 | 90 | 90 | 90 | 90 |
| Optically anisotropic layer | Wavelength dispersion | Reverse dispersion | Reverse dispersion | Reverse dispersion | Reverse dispersion | Reverse dispersion | Reverse dispersion | Reverse dispersion | Reverse dispersion |
|  | Initial axis [°] | 45 | 90 | 90 | 90 | 90 | 90 | 90 | 90 |
|  | Δnd [nm] | 142 | 200 | 200 | 200 | 200 | 200 | 210 | 220 |
|  | Twisted angle [°] | 0 | 64 | 69 | 72 | 69 | 56 | 64 | 64 |
| Evaluation | Average Y [%] | A | A | B | C | A | C | A | C |
|  | Δa* | B | A | A | A | A | A | A | A |
|  | Δb* | B | A | A | A | A | A | A | A |

|  |  | Example A8 | Example A9 | Example A10 | Example A11 | Example A12 | Example A13 | Example A14 | Example A15 |
|---|---|---|---|---|---|---|---|---|---|
| Polarizer | Axis [°] | 90 | 90 | 90 | 90 | 90 | 90 | 90 | 90 |
| Optically anisotropic layer | Wavelength dispersion | Reverse dispersion | Reverse dispersion | Reverse dispersion | Reverse dispersion | Reverse dispersion | Reverse dispersion | Reverse dispersion | Reverse dispersion |
|  | Initial axis [°] | 90 | 90 | 95 | 85 | 90 | 90 | 90 | 90 |
|  | Δnd [nm] | 190 | 180 | 200 | 200 | 240 | 160 | 200 | 200 |
|  | Twisted angle [°] | 64 | 64 | 64 | 64 | 64 | 64 | 44 | 84 |
| Evaluation | Average Y [%] | A | B | C | B | D | D | D | D |
|  | Δa* | A | A | A | A | A | A | A | A |
|  | Δb* | A | A | A | A | A | A | A | A |

A: It is less than 25

B: It is 25 or more

In addition, Δb* was evaluated according to the following standards. The evaluation of A is preferable in terms of practical use.

A: It is less than 19

B: It is 19 or more

In Table 1, as for "Axis [° ]" in the column of "Polarizer", the position of an absorption axis of the polarizer is represented by a positive value in a counterclockwise direction with a width direction of a circularly polarizing plate as a reference (0°), upon observation of the circularly polarizing plate from the polarizer side.

It represents an angle formed by the width direction (transport direction) of the circularly polarizing plate and the absorption axis of the polarizer.

In Table 1, as for the column of "LC dispersion", it is represented by "Reverse dispersion" in a case where the liquid crystal compound used is a liquid crystal compound having reverse wavelength dispersibility, and it is represented by "Forward dispersion" in a case where the liquid crystal compound used is a liquid crystal compound having forward wavelength dispersibility.

In Table 1, as for the column of "Initial axis [° ]", the position of an in-plane slow axis on a surface of an optically anisotropic layer on the polarizer side is represented by a positive value in a counterclockwise direction with the width As shown in Table 1, it was confirmed that a desired effect can be obtained by using the circularly polarizing plate according to the embodiment of the present invention (corresponding to the first embodiment).

Above all, from the comparison of Examples A1 to A5, A14, and A15, it was confirmed that an effect was more excellent in a case where the twisted angle of the liquid crystal compound was 54° to 74° (preferably 59° to 69°).

In addition, from the comparison of Examples A1, A6 to A9, A12, and A13, it was confirmed that an effect was more excellent in a case where a product Δnd of Δn at a wavelength of 550 nm and d of an optically anisotropic layer was in a range of 170 to 230 nm (preferably 180 to 220 nm and more preferably 190 to 210 nm).

In addition, from the comparison of Examples A1, A10, and A11, it was confirmed that an effect was more excellent in a case where the angle formed by the absorption axis of the polarizer and the in-plane slow axis of the optically anisotropic layer was less than 5°.

Example B1

The cellulose acylate film prepared above was continuously subjected to a rubbing treatment. At this time, the longitudinal direction and the transport direction of the elongated film were parallel, and the angle between the film longitudinal direction (transport direction) and the rubbing roller rotation axis was 76°. The rotation axis of the rubbing roller was 14° in a case where the longitudinal direction (transport direction) of the film was defined as 90°, and the counterclockwise direction was represented by a positive value with reference to the width direction of the cellulose acylate film (0°), upon observation of the film from the cellulose acylate film side. In other words, the position of the rotation axis of the rubbing roller was a position rotated by 76° clockwise with reference to the longitudinal direction of the cellulose acylate film.

The following optically anisotropic layer coating liquid (B) containing a rod-like liquid crystal compound was applied onto the rubbing-treated film using a geeser coating machine, and heated at 80° C. for 60 seconds. This was followed by irradiation with light of a 365 nm LED lamp

| Composition of optically anisotropic layer coating liquid (B) | |
|---|---|
| Rod-like liquid crystal compound (A) given above | 40 parts by mass |
| Rod-like liquid crystal compound (B) given above | 40 parts by mass |
| Rod-like liquid crystal compound (C) given above | 20 parts by mass |
| Ethylene oxide-modified trimethylolpropane triacrylate (V# 360, manufactured by Osaka Organic Chemical Industry Ltd.) | 4 parts by mass |
| Photopolymerization initiator (IRGACURE 819, manufactured by BASF Japan Ltd.) | 3 parts by mass |
| Chiral agent (A) given above | 0.51 parts by mass |
| Chiral agent (B) given below | 0.46 parts by mass |
| Polymerizable polymer (X) given above | 0.5 parts by mass |
| Polymer (A) given above | 0.1 parts by mass |
| Methyl isobutyl ketone | 325 parts by mass |

(Chiral agent B)

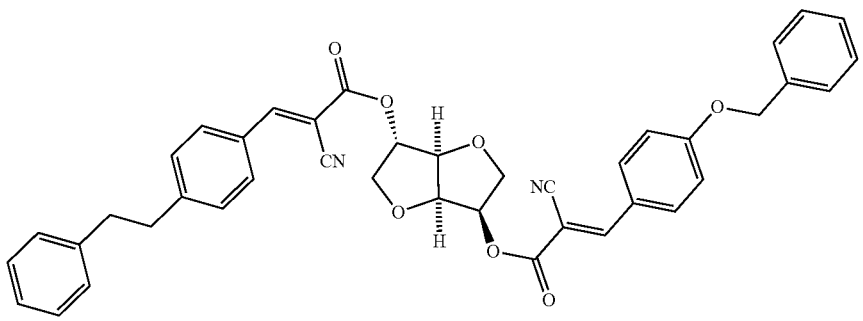

(manufactured by AcroEdge Corporation) at an irradiation amount of 40 mJ/cm² under air at 40° C. to immobilize the alignment state of the liquid crystal compound in a half region on the cellulose acylate film side in the coating film.

Further, after heating at 80° C. for 10 seconds, followed by irradiation with light of a metal halide lamp (manufactured by Eye Graphics Co., Ltd.) at an irradiation amount of 500 mJ/cm² and at 80° C. in a nitrogen atmosphere to immobilize the liquid crystal compound in a half region on the air side in the coating film to prepare an optically anisotropic layer.

The optically anisotropic layer is composed of two layers exhibiting different optical anisotropy, and the layer on the cellulose acylate film side (second optically anisotropic layer) in the optically anisotropic layer is a layer formed by fixing a liquid crystal compound homogeneously aligned and having reverse wavelength dispersibility. This layer had a product $\Delta nd$ of $\Delta n$ at a wavelength of 550 nm and d of 198 nm and an in-plane slow axis of 104°. In addition, the air side layer (first optically anisotropic layer) in the optically anisotropic layer was a layer formed by fixing a liquid crystal compound having reverse wavelength dispersibility twist-aligned with a thickness direction as a helical axis, the molecular axis of the liquid crystal compound in the layer was horizontal to the surface of the optically anisotropic layer, the product $\Delta nd$ of $\Delta n$ at a wavelength of 550 nm and d of this layer was 191 nm, and the direction of the in-plane slow axis was 104° on the film side surface and 189° on the air side surface (twisted angle=85°).

The above angle is represented by a positive value in a counterclockwise direction with the width direction of the cellulose acylate film as a reference (0°), upon observation of the optically anisotropic layer from the cellulose acylate film side.

(Preparation of Circularly Polarizing Plate)

A laminate including a polarizer and a polarizer protective film disposed on one surface of the polarizer was prepared according to the method described in Example A1.

A pressure sensitive adhesive (SK-2057, manufactured by Soken Chemical & Engineering Co., Ltd.) was applied to the polarizer side (side with no polarizer protective film) in the above prepared laminate to form a pressure sensitive adhesive layer, and the above prepared film having a cellulose acylate film and an optically anisotropic layer was bonded thereto such that the pressure sensitive adhesive layer and the cellulose acylate film were in close contact with each other. The bonding was carried out so that the absorption axis of the polarizer was at the angular position shown in Table 2 which will be described later.

Next, a pressure sensitive adhesive was applied onto the optically anisotropic layer in the obtained laminate to form a pressure sensitive adhesive layer.

An elongated circularly polarizing plate B1 in which the polarizer, the cellulose acylate film, the optically anisotropic layer, and the pressure sensitive adhesive layer were disposed in this order was prepared by the above procedure.

Examples B2 to B19

Circularly polarizing plates B2 to B19 were prepared in the same manner as in Example B1, except that the amount of the chiral agent used and the thickness of the optically anisotropic layer were adjusted so that the retardation and the twisted angle as shown in Table 2 were obtained, and the rubbing axis angle and the like were adjusted so that the axial relationship of each layer as shown in Table 2 was obtained.

The molecular axis of the liquid crystal compound in the first optically anisotropic layer in the circularly polarizing plates A2 to A15 was horizontal to the surface of the first optically anisotropic layer.

Comparative Example B1

A circularly polarizing plate BC1 was prepared in the same manner as in Example B1, except that the rod-like liquid crystal compound (C) was used instead of the rod-like liquid crystal compounds (A) and (B), the amount of the chiral agent used and the thickness of the optically anisotropic layer were adjusted so that the retardation and the twisted angle as shown in Table 2 were obtained, and the rubbing axis angle and the like were adjusted so that the axial relationship of each layer as shown in Table 2 was obtained.

In the circularly polarizing plate BC1, a liquid crystal compound having forward wavelength dispersibility was used as the liquid crystal compound.

The <Evaluation> carried out in Example A1 described above was carried out using each of the circularly polarizing plates B1 to B19 or BC1 prepared above.

The results are summarized in Table 2.

In Table 2, as for "Axis [° ]" in the column of "Polarizer", the position of the absorption axis of the polarizer is represented by a positive value in a counterclockwise direction with the width direction of the circularly polarizing plate as a reference (0°), upon observation of the circularly polarizing plate from the polarizer side.

In Table 2, as for the column of "LC dispersion", it is represented by "Reverse dispersion" in a case where the liquid crystal compound used is a liquid crystal compound having reverse wavelength dispersibility, and it is represented by "Forward dispersion" in a case where the liquid crystal compound used is a liquid crystal compound having forward wavelength dispersibility.

In Table 2, the column of "$\Delta$nd [nm]" represents a product $\Delta$nd (nm) of $\Delta$n at a wavelength of 550 nm and d (thickness) of the optically anisotropic layer.

In Table 2, as for the column of "Initial axis [° ]", the position of the in-plane slow axis on the surface of the optically anisotropic layer on the polarizer side is represented by a positive value in a counterclockwise direction with the width direction of the circularly polarizing plate as a reference (0°), upon observation of the circularly polarizing plate from the polarizer side.

TABLE 2

| | | Comparative Example B1 | Example B1 | Example B2 | Example B3 | Example B4 | Example B5 | Example B6 |
|---|---|---|---|---|---|---|---|---|
| Polarizer | Axis [°] | 90 | 90 | 90 | 90 | 90 | 90 | 90 |
| Second optically anisotropic layer | Wavelength dispersion | Forward dispersion | Reverse dispersion | Reverse dispersion | Reverse dispersion | Reverse dispersion | Reverse dispersion | Reverse dispersion |
| | Initial axis [°] | 103 | 104 | 104 | 104 | 104 | 104 | 104 |
| | $\Delta$nd [nm] | 181 | 198 | 198 | 198 | 198 | 198 | 208 |
| | Twisted angle [°] | 0 | 0 | 0 | 0 | 0 | 0 | 0 |
| First optically anisotropic layer | Wavelength dispersion | Forward dispersion | Reverse dispersion | Reverse dispersion | Reverse dispersion | Reverse dispersion | Reverse dispersion | Reverse dispersion |
| | Initial axis [°] | 103 | 104 | 104 | 104 | 104 | 104 | 104 |
| | $\Delta$nd [nm] | 172 | 191 | 191 | 191 | 191 | 191 | 191 |
| | Twisted angle [°] | 81 | 85 | 99 | 93 | 80 | 77 | 85 |
| Evaluation | Average Y [%] | B | A | B | C | B | C | A |
| | $\Delta$a* | B | A | A | A | A | A | A |
| | $\Delta$b* | B | A | A | A | A | A | A |

| | | Example B7 | Example B8 | Example B9 | Example B10 | Example B11 | Example B12 | Example B13 |
|---|---|---|---|---|---|---|---|---|
| Polarizer | Axis [°] | 90 | 90 | 90 | 90 | 90 | 90 | 90 |
| Second optically anisotropic layer | Wavelength dispersion | Reverse dispersion | Reverse dispersion | Reverse dispersion | Reverse dispersion | Reverse dispersion | Reverse dispersion | Reverse dispersion |
| | Initial axis [°] | 104 | 104 | 104 | 104 | 104 | 109 | 99 |
| | $\Delta$nd [nm] | 218 | 188 | 178 | 198 | 198 | 198 | 198 |
| | Twisted angle [°] | 0 | 0 | 0 | 0 | 0 | 0 | 0 |
| First optically anisotropic layer | Wavelength dispersion | Reverse dispersion | Reverse dispersion | Reverse dispersion | Reverse dispersion | Reverse dispersion | Reverse dispersion | Reverse dispersion |
| | Initial axis [°] | 104 | 104 | 104 | 104 | 104 | 109 | 99 |
| | $\Delta$nd [nm] | 191 | 191 | 191 | 201 | 181 | 191 | 191 |
| | Twisted angle [°] | 85 | 85 | 85 | 85 | 85 | 85 | 85 |
| Evaluation | Average Y [%] | B | A | B | C | A | C | C |
| | $\Delta$a* | A | A | A | A | A | A | A |
| | $\Delta$b* | A | A | A | A | A | A | A |

| | | Example B14 | Example B15 | Example B16 | Example B17 | Example B18 | Example B19 |
|---|---|---|---|---|---|---|---|
| Polarizer | Axis [°] | 90 | 90 | 90 | 90 | 90 | 90 |
| Second | Wavelength | Reverse | Reverse | Reverse | Reverse | Reverse | Reverse |

TABLE 2-continued

| | | | | | | | |
|---|---|---|---|---|---|---|---|
| optically anisotropic layer | dispersion Initial axis [°] Δnd [nm] Twisted angle [°] | dispersion 104 220 0 | dispersion 104 140 0 | dispersion 104 198 0 | dispersion 104 198 0 | dispersion 104 198 0 | dispersion 104 198 0 |
| First optically anisotropic layer | Wavelength dispersion Initial axis [°] Δnd [nm] Twisted angle [°] | Reverse dispersion 104 191 85 | Reverse dispersion 104 191 85 | Reverse dispersion 104 230 85 | Reverse dispersion 104 150 85 | Reverse dispersion 104 191 105 | Reverse dispersion 104 191 65 |
| Evaluation | Average Y [%] Δa* Δb* | B A A | D A A | D A A | D A A | D A A | D A A |

As shown in Table 2, it was confirmed that a desired effect could be obtained by using the circularly polarizing plate according to the embodiment of the present invention (corresponding to the second embodiment).

Above all, from the comparison of Examples B1 to B5, B18, and B19, it was confirmed that an effect was more excellent in a case where the twisted angle of the liquid crystal compound in the first optically anisotropic layer was in a range of 75° to 95° (preferably, 80° to) 90°.

In addition, from the comparison of Examples B1, B6 to B9, B14, and B15, it was confirmed that an effect was more excellent in a case where the Δnd of the second optically anisotropic layer was in a range of 180 to 220 nm (preferably 190 to 210 nm).

In addition, from the comparison of Examples B10, B11, B16, and B17, it was confirmed that a more excellent effect was obtained in a case where the Δnd of the first optically anisotropic layer was in a range of 160 to 220 nm (preferably 170 to 210 nm).

In addition, from the comparison of Examples B1, B12, and B13, it was confirmed that a more excellent effect was obtained in a case where the angle formed by the absorption axis of the polarizer and the in-plane slow axis of the second optically anisotropic layer was in a range of 13°±3°.

Explanation of References

10: polarizer
12: optically anisotropic layer
14: first optically anisotropic layer
16: second optically anisotropic layer
18: support
20: composition layer
20A: first region
20B: second region
22: third optically anisotropic layer
24: fourth optically anisotropic layer
100a, 100b, 100c: circularly polarizing plate

What is claimed is:

1. A circularly polarizing plate comprising:
a polarizer; and
an optically anisotropic layer,
wherein the optically anisotropic layer is a layer formed by fixing a liquid crystal compound having reverse wavelength dispersibility twist-aligned with a thickness direction as a helical axis,
a molecular axis of the liquid crystal compound in the optically anisotropic layer is horizontal to a surface of the optically anisotropic layer,
a twisted angle of the twist-aligned liquid crystal compound is 15° to 360°, and
wherein the polarizer, a second optically anisotropic layer, and a first optically anisotropic layer are provided in this order,
the first optically anisotropic layer is a layer formed by fixing a liquid crystal compound having reverse wavelength dispersibility twist-aligned with a thickness direction as a helical axis,
a molecular axis of the liquid crystal compound in the first optically anisotropic layer is horizontal to a surface of the first optically anisotropic layer, and
the second optically anisotropic layer is a layer formed by fixing a liquid crystal compound having reverse wavelength dispersibility homogeneously aligned.

2. The circularly polarizing plate according to claim 1, wherein a twisted angle of the liquid crystal compound in the first optically anisotropic layer is 85°±20°,
an in-plane slow axis on a surface of the first optically anisotropic layer on a second optically anisotropic layer side is parallel to an in-plane slow axis on a surface of the second optically anisotropic layer on a first optically anisotropic layer side,
a value of a product $\Delta n1 d1$ of a refractive index anisotropy $\Delta n1$ of the first optically anisotropic layer measured at a wavelength of 550 nm and a thickness d1 of the first optically anisotropic layer satisfies a relationship of Expression (1), and
a value of a product $\Delta n2 d2$ of a refractive index anisotropy $\Delta n2$ of the second optically anisotropic layer measured at a wavelength of 550 nm and a thickness d2 of the second optically anisotropic layer satisfies a relationship of Expression (2), $$150 \text{ nm} \leq \Delta n1 d1 \leq 230 \text{ nm} \quad \text{Expression (1)}$$

$$140 \text{ nm} \leq \Delta n2 d2 \leq 220 \text{ nm}. \quad \text{Expression (2)}$$

3. The circularly polarizing plate according to claim 2, wherein the liquid crystal compound having reverse wavelength dispersibility is a rod-like liquid crystal compound having reverse wavelength dispersibility.

4. An organic electroluminescent display device comprising:
the circularly polarizing plate according to claim 2.

5. The circularly polarizing plate according to claim 1, wherein the liquid crystal compound having reverse wavelength dispersibility is a rod-like liquid crystal compound having reverse wavelength dispersibility.

6. An organic electroluminescent display device comprising:
the circularly polarizing plate according to claim 5.

7. An organic electroluminescent display device comprising:
the circularly polarizing plate according to claim 1.

* * * * *